(12) United States Patent
Wu et al.

(10) Patent No.: US 12,745,628 B2
(45) Date of Patent: Sep. 22, 2026

(54) EMBEDDING A METAL-INSULATOR-METAL CAPACITOR IN A PASSIVATION LAYER

(71) Applicant: Taiwan Semiconductor Manufacturing Company, Ltd., Hsin-Chu (TW)

(72) Inventors: Ying-Ju Wu, Hsinchu (TW); Tzu-Ting Liu, Taoyuan City (TW); Hsiang-Ku Shen, Hsinchu City (TW); Chen-Chiu Huang, Taichung City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 334 days.

(21) Appl. No.: 18/483,695

(22) Filed: Oct. 10, 2023

(65) Prior Publication Data

US 2025/0118654 A1 Apr. 10, 2025

(51) Int. Cl.

| | |
|---|---|
| ***H10W 20/40*** | (2026.01) |
| ***H10D 1/68*** | (2025.01) |
| ***H10W 20/00*** | (2026.01) |
| ***H10W 20/42*** | (2026.01) |

(52) U.S. Cl.

CPC .......... *H10W 20/496* (2026.01); *H10D 1/692* (2025.01); *H10W 20/056* (2026.01); *H10W 20/083* (2026.01); *H10W 20/42* (2026.01)

(58) Field of Classification Search

CPC ........... H01L 23/5223; H01L 21/76805; H01L 21/76877; H01L 23/5226; H10D 1/692; H10W 20/496; H10W 20/056; H10W 20/083; H10W 20/42

See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

FOREIGN PATENT DOCUMENTS

| | | | |
|---|---|---|---|
| TW | 200527584 | A | 8/2005 |
| TW | 200707767 | A | 2/2007 |

(Continued)

*Primary Examiner* — David Vu
*Assistant Examiner* — Brandon C Fox
(74) *Attorney, Agent, or Firm* — HAYNES AND BOONE, LLP

(57) ABSTRACT

A passivation layer is formed over an interconnect structure. An opening is etched at least partially through the passivation layer. A first conductive layer is deposited over the passivation layer. The first conductive layer partially fills the opening. An insulator layer is deposited over the first conductive layer. The insulator layer partially fills the opening. A second conductive layer is deposited over the insulator layer. The second conductive layer completely fills the opening. A first conductive structure is formed that is electrically coupled to the first conductive layer. A second conductive structure is formed that is electrically coupled to the second conductive layer.

20 Claims, 19 Drawing Sheets

(56) References Cited

U.S. PATENT DOCUMENTS

| | | | | |
|---|---|---|---|---|
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 2011/0291235 | A1 | 12/2011 | Xiao | |
| 2012/0091519 | A1 | 4/2012 | Tu | |
| 2019/0035674 | A1* | 1/2019 | Chiu | H10D 1/716 |
| 2021/0202761 | A1 | 7/2021 | Cheng | |
| 2023/0068481 | A1 | 3/2023 | Kuo | |
| 2025/0062219 | A1* | 2/2025 | Ogino | H10W 20/496 |
| 2025/0324619 | A1* | 10/2025 | Wu | H10D 1/042 |
| 2025/0336801 | A1* | 10/2025 | Gambino | H10W 20/496 |

FOREIGN PATENT DOCUMENTS

| | | | |
|---|---|---|---|
| TW | 200744132 | A | 12/2007 |
| TW | 201123397 | A | 7/2011 |

* cited by examiner 100
120
130
131
140
110
115

100
Deposition Process
345
340
310A
280
210A
120
350
150
130
140
110
115
280A
131
310B
210B

EMBEDDING A METAL-INSULATOR-METAL CAPACITOR IN A PASSIVATION LAYER

BACKGROUND

The semiconductor integrated circuitry (IC) industry has experienced rapid growth. Technological advances in IC design and material have produced generations of ICs where each generation has smaller and more complex circuits than previous generations. During the course of IC evolution, functional density (i.e., the number of interconnected devices per unit chip area) has generally increased while geometry size (i.e., the smallest component (or line) that can be created using a fabrication process) has decreased.

As the semiconductor device scaling down continues, challenges in fabrication may arise. For example, a metal-insulator-metal (MIM) structure may be used to implement microelectronic components, such as capacitors. However, in order to increase a capacitance of the MIM capacitor, an area (and thus size) of the MIM capacitor is generally enlarged as well. As semiconductor device progress to more advanced (e.g., smaller) technology nodes, it may be difficult to allocate the area needed to achieve the capacitance of MIM capacitors. As a result, the performance of the MIM capacitors may be degraded. Therefore, although semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
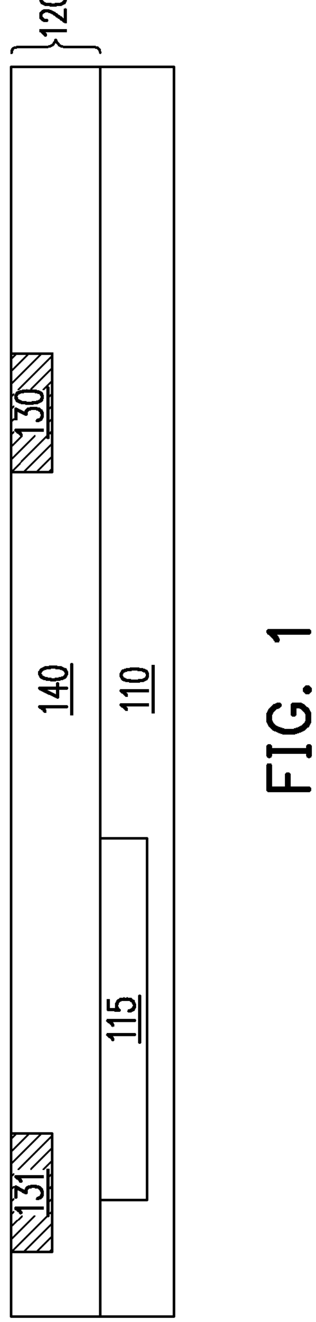
FIGS. 1-13 are cross-sectional side views of an integrated circuitry (IC) device (or portions thereof) at various stages of fabrication according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. For example, if the device in the figures is turned over, elements described as being “below” or “beneath” other elements or features would then be oriented “above” the other elements or features. Thus, the exemplary term “below” can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with “about,” “approximate,” and the like, the term is intended to encompass numbers that are within a reasonable range including the number described, such as within +/−10% of the number described or other values as understood by person skilled in the art. For example, the term “about 5 nm” encompasses the dimension range from 4.5 nm to 5.5 nm.

Integrated Circuitry (IC) chips contain a plurality of different types of microelectronic components, such as transistors, resistors, inductors, capacitors, etc. For each of these types of microelectronic components, there may be a variety of methods of fabrication, resulting in different structures thereof. In some cases, capacitors may be implemented using a metal-insulator-metal (MIM) structure, for example, as a part of either a copper (Cu) redistribution layer (RDL) scheme or an aluminum copper (AlCu) RDL scheme. The MIM structure may include a plurality of metal-containing layers and a plurality of insulator layers, where each of the insulator layers is located between two respective metal-containing layers.

Achieving a high capacitance may be desirable for the MIM capacitors on an IC. However, since the semiconductor feature sizes shrink with each technology generation, the effective areas of the MIM capacitors may also shrink, which may negatively impact capacitance. Additional layers of metal and insulator layers could be implemented to effectively increase the capacitance of MIM capacitors on an IC. However, doing so may further complicate fabrication processing, prolong production time, and increase production cost. To address these issues, the present disclosure involves a fabrication method and scheme that implements trenches in a passivation layer, where a MIM capacitor could be formed at least in part in the trenches in the passivation layer. The trenches allow the MIM capacitor to gain additional surface area (e.g., based on the depth of the trenches) without needing additional metal layers or insulator layers. Consequently, the MIM capacitor formed according to the aspects of the present disclosure can still achieve a relatively high capacitance without substantially complicating fabrication processing or increasing fabrication costs.

The process flow for implementing the MIM capacitor of the present disclosure is now discussed below with reference to FIGS. 1-13, which are diagrammatic fragmentary cross-sectional side view drawings of an IC device 100 (e.g., a work piece) constructed according to various aspects of the present disclosure in some embodiments.

Referring now to FIG. 1, the IC device 100 includes an IC substrate 110. In some embodiments, the IC substrate 110 includes a semiconductor substrate, such as a silicon substrate. The IC substrate 110 may also include various devices, such as field-effect transistors (FETs), memory cells, imaging sensors, passive devices, other devices, or combinations thereof. In some embodiments, the IC substrate 110 includes flat active regions with various IC devices, such as plain field-effect transistors (FETs). In some other embodiments, the IC substrate 110 includes fin (e.g., vertically protruding) active regions with various IC devices formed thereon. It is understood that the fin active regions may also be used to form gate-all-around (GAA) devices in some embodiments. In any case, as a simplified non-limiting example herein, electrical circuitry 115 is shown as being formed in the IC substrate 110 in FIG. 1. The electrical circuitry 115 may include planar type transistors or FinFET type (or GAA type) transistors.

The IC device 100 also includes an interconnection structure 120 formed over the semiconductor substrate. The interconnection structure 120 includes various conductive components, such as metal lines (e.g., metal line 130 or metal line 131), contacts, and vias, to provide horizontal and vertical electrical routing. The metal lines such as the metal line 130 are distributed in multiple levels of metal layers, such as a first metal layer (e.g., a M1 layer), a second metal layer (e.g., a M2 layer), . . . and a top metal layer. In the illustrated embodiments, the metal lines 130-131 belong to a topmost metal layer of the interconnect structure 120, and the metal lines and/or vias of the other metal layers of the interconnect structure 120 are not specifically illustrated herein for reasons of simplicity.

Among other things, the conductive components of the interconnection structure 120 may provide electrical connectivity to the electrical circuitry 115. The interconnection structure 120 also includes a dielectric material 140 to provide electrical isolation among the various conductive components, so as to prevent electrical shorting. In some embodiments, the dielectric material 140 may include an oxide material, such as silicon oxide. It may be said that the metal lines such as metal lines 130-131 are embedded in the dielectric material 140.

Figure 2:
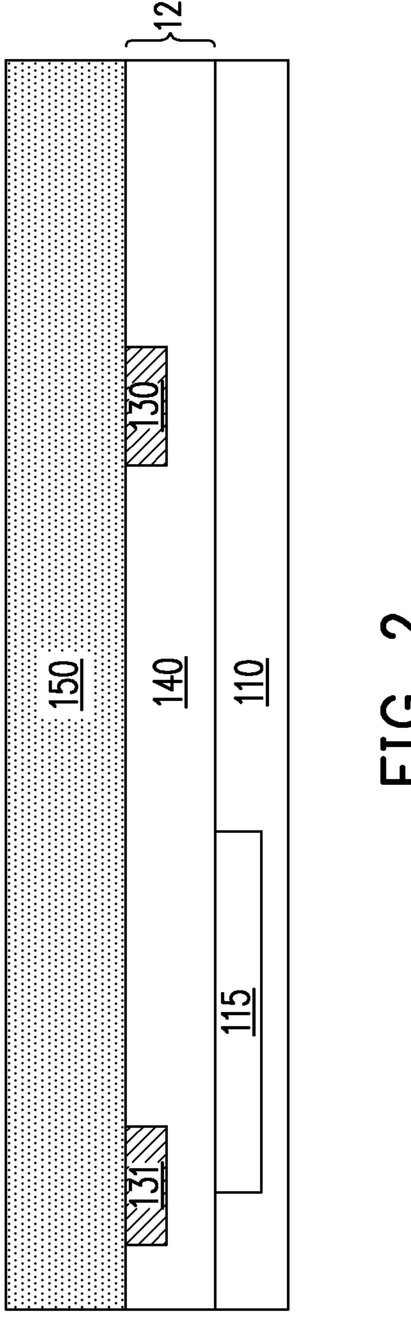

Referring now to FIG. 2, a planarization process, such as a chemical mechanical polishing (CMP) process, may be performed to planarize an upper surface of the interconnect structure 120. Thereafter, a passivation layer 150 may be formed over the planarized upper surface of the interconnect structure 120, including over the metal lines 130 and 131. In some embodiments, the passivation layer 150 may be formed using one or more deposition processes, such as chemical vapor deposition (CVD), physical vapor deposition (PVD), atomic layer deposition (ALD), or combinations thereof. In some embodiments, the passivation layer 150 is formed to have a silicon carbon nitride (SiCN) material composition. In some other embodiments, the passivation layer 150 may have a silicon nitride (SiN) material composition. In yet other embodiments, the passivation layer 150 may include another type of dielectric material that is not SiCN or SiN. It is in this passivation layer 150 that the MIM capacitor of the present disclosure will be partially embedded, as discussed in more detail below.

Figure 3:
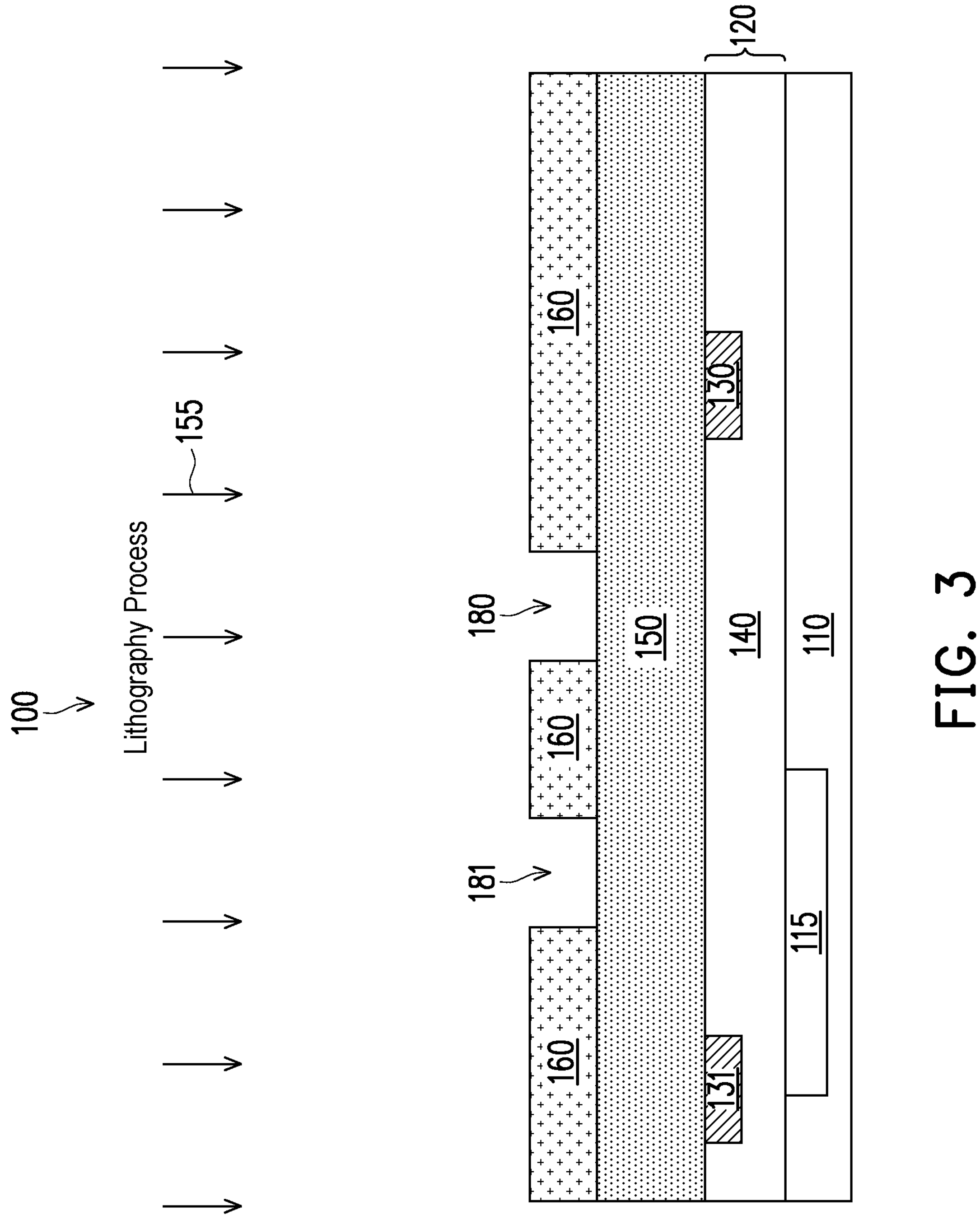

Referring now to FIG. 3, a lithography process 155 is performed to the IC device 100 to form a patterned photoresist layer 160 over the passivation layer 150. The lithography process 155 may include one or more photoresist coating, pre-exposure baking, exposing, post exposure baking, developing, and rinsing processes (not necessarily performed in that order). As a result of the lithography process 155 being performed, the patterned photoresist layer 160 includes a plurality of openings, such as openings 180 and 181 that each exposes a portion of an upper surface of the passivation layer 150.

Figure 4:
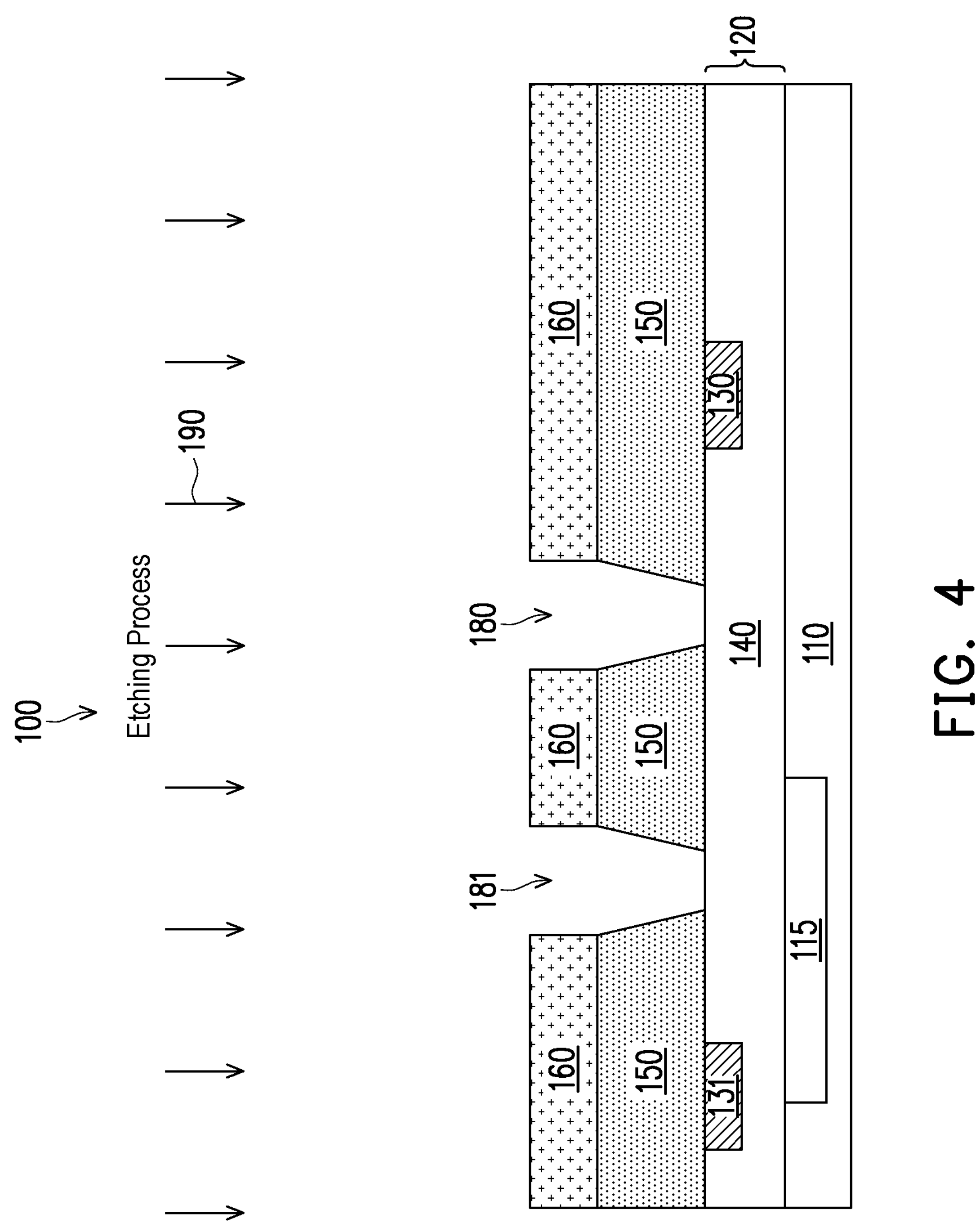

Referring now to FIG. 4, an etching process 190 is performed to the IC device 100. The etching process 190 may include a dry etching process in some embodiments, a wet etching process in some other embodiments, or combinations thereof in yet other embodiments. The etching process 190 extends the openings 180 and 181 further downwards vertically (e.g., in the direction toward the substrate 110), with the patterned photoresist layer 160 serving as an etching mask. In other words, the patterned photoresist layer 160 protects the portions of the passivation layer 150 underneath from being etched, while the other portions of the passivation layer 150 exposed by the openings 180 and 181 are removed by the etching process 190. The openings 180 and 181 in the passivation layer 150 may have a trench-like profile, and as such, may be interchangeably referred to as trenches 180 and 181. Note that the lower portions of the openings 180 and 181 may each have a trapezoidal shape in the cross-sectional side view of FIG. 4, in that the openings 180 and 181 are each wider at the top and narrower at the bottom, with slanted side surfaces. Also note that the openings 180 and 181 may or may not extend all the way through the passivation layer 150. In other words, the openings 180 and 181 may expose the upper surfaces of the interconnect structure 120 in some embodiments, or the openings 180 and 181 may not expose the upper surface of the interconnect structure 120 in some other embodiments.

Figure 5:
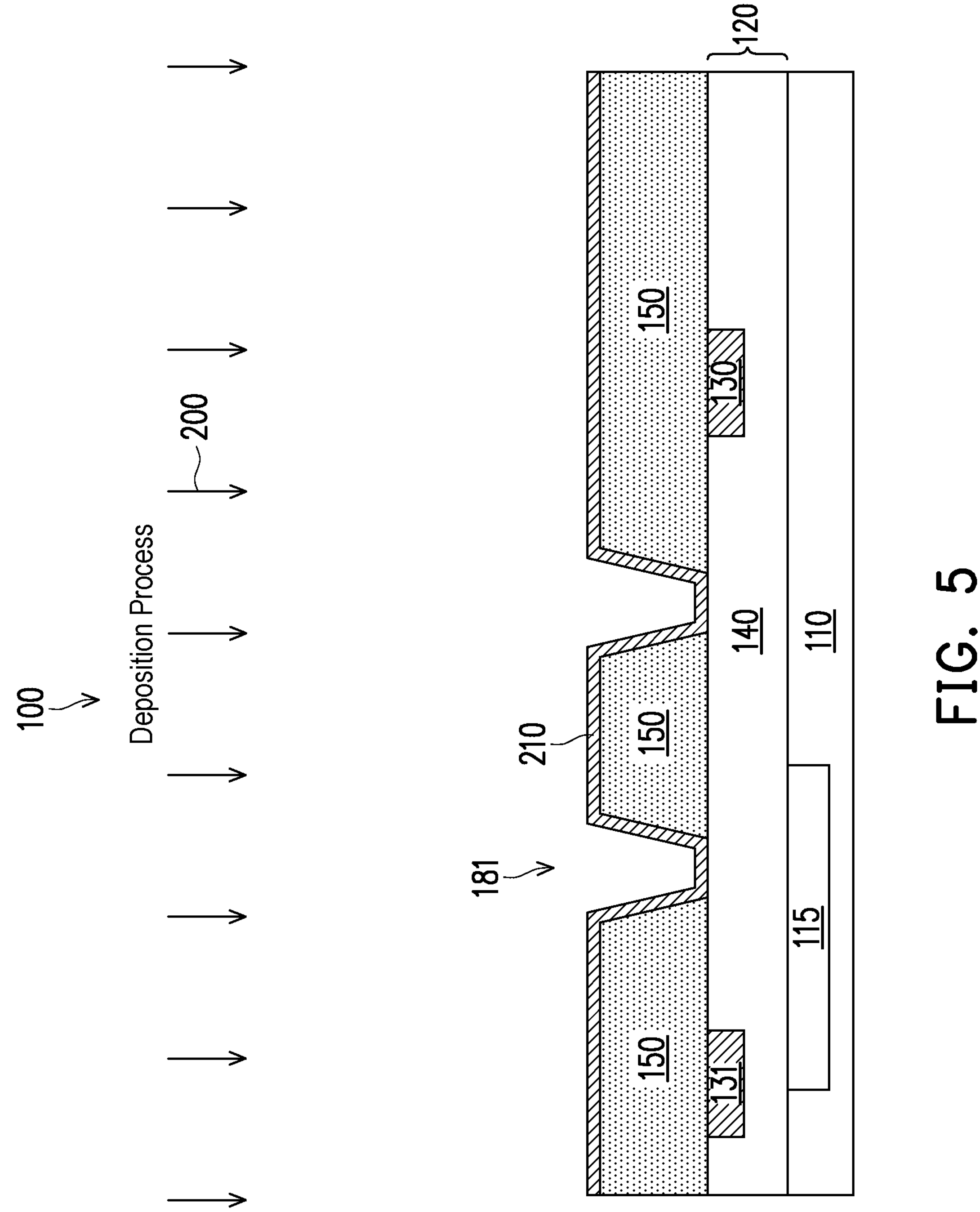

Referring now to FIG. 5, the patterned photoresist layer 160 is removed, for example, via a photoresist stripping process or a photoresist ashing process. Thereafter, a deposition process 200 is performed to the IC device 100 to deposit a conductive layer 210 over the IC device 100. In some embodiments, the conductive layer 210 may include a CVD process, a PVD process, an ALD process, or combinations thereof. In some embodiments, the deposition process 200 deposits titanium nitride (TiN) as the conductive layer 210, though it is understood that other types of conductive material (e.g., titanium aluminum or copper) may be deposited as the conductive layer 210 in other embodiments. As shown in FIG. 5, some portions of the conductive layer 210 are formed on the upper surfaces of the passivation layer 150, and some other portions of the conductive layer 210 are formed on the bottom surfaces and side surfaces of the openings 180 and 181. In other words, portions of the conductive layer 210 are formed partially in the openings 180 and 181.

Figure 6:
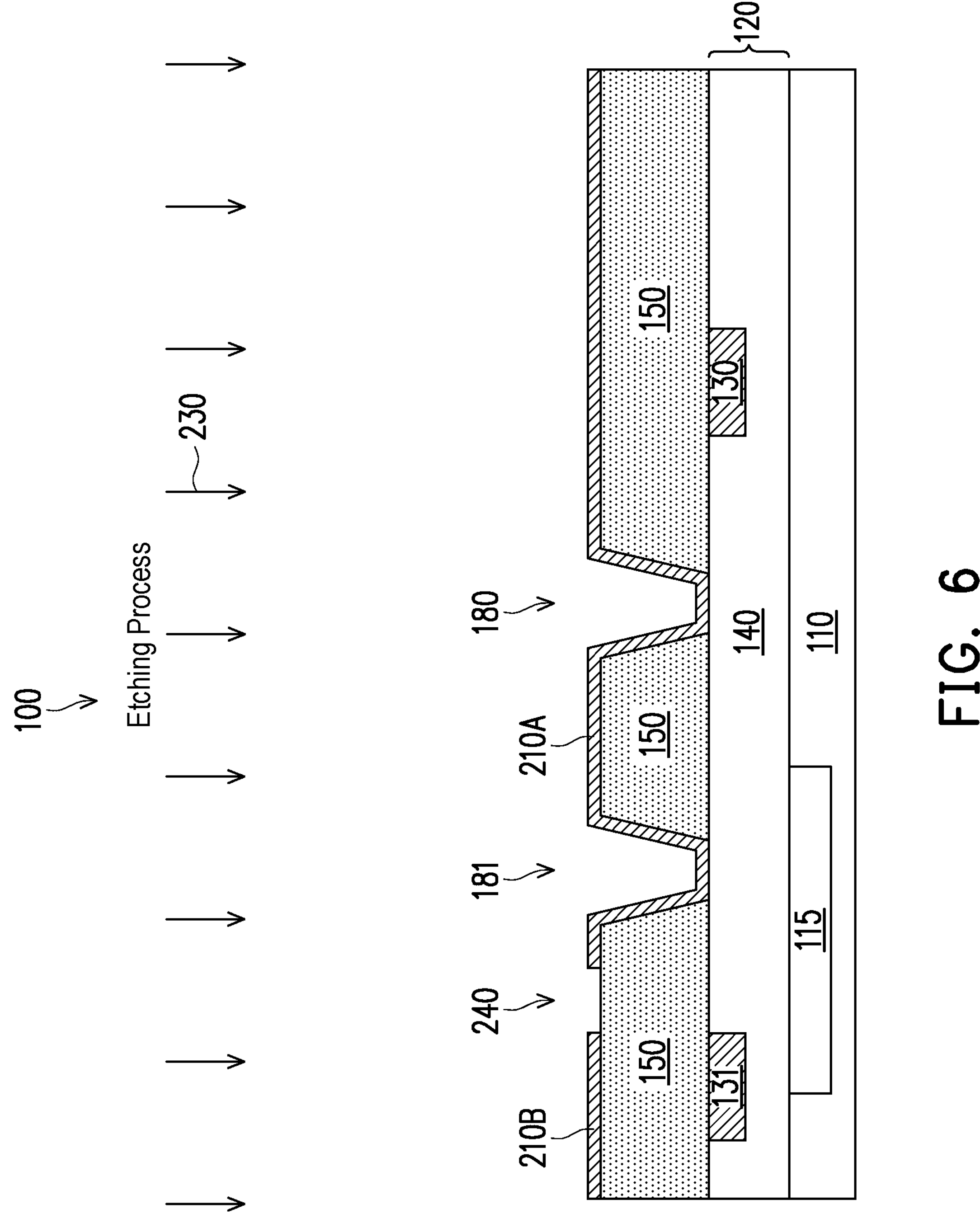

Referring now to FIG. 6, an etching process 230 is performed to the IC device 100. The etching process 230 etches away a segment of the conductive layer 210 that is disposed horizontally between the metal line 131 and the opening 181. As a result, an opening 240 in the conductive layer 210 exposes a portion of an upper surface of the passivation layer 150 disposed between the metal line 131 and the opening 181. The conductive layer 210 is therefore broken up into two segments 210A and 210B, which are electrically isolated or separated from each other by the opening 240. Note that the etching process 230 may be performed with a patterned photoresist layer serving as an etching mask in some embodiments. However, for reasons of simplicity, the formation and subsequent removal of the patterned photoresist layer is not specifically illustrated herein.

Figure 7:
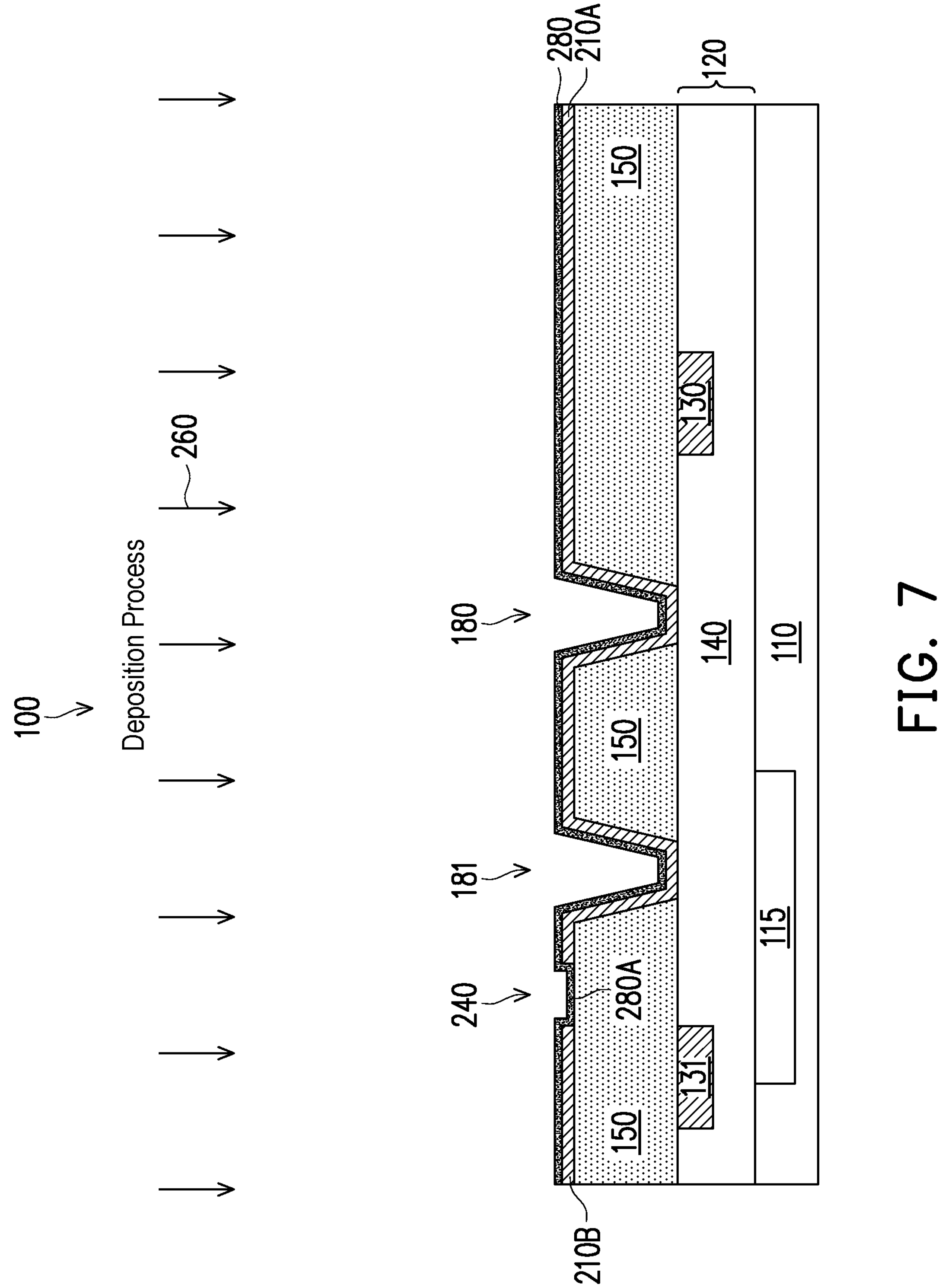

Referring now to FIG. 7, a deposition process 260 is performed to the IC device 100. The deposition process 260 may include CVD. PVD, ALD, or combinations thereof. The deposition process 260 deposits an insulator layer 280 over the passivation layer 150 and over the conductive layer segments 210A and 210B. In some embodiments, the insulator layer 280 may include a high-k dielectric material, which is a dielectric material having a dielectric constant greater than the dielectric constant of silicon dioxide (e.g., >4). In some embodiments, the insulator layer 280 includes hafnium oxide. In other embodiments, the insulator layer 280 includes zirconium oxide. Other types of dielectric materials may also be implemented as the insulator layer 280 in yet other embodiments.

As shown in FIG. 7, a segment of the insulator layer 280A is deposited in the opening 240 and directly on an upper surface of the passivation layer 150, while the rest of the insulator layer 280 is deposited on the upper surfaces and side surfaces of the conductive layer segments 210A and 210B. The presence of the insulator layer segment 280A in the opening 240 helps to ensure that the conductive layer segment 210A is electrically isolated from the conductive layer segment 210B. In other words, an electrical signal cannot propagate from the conductive layer segment 210A to the conductive layer segment 210B (or vice versa) through the insulator layer segment 280A.

Figure 8:
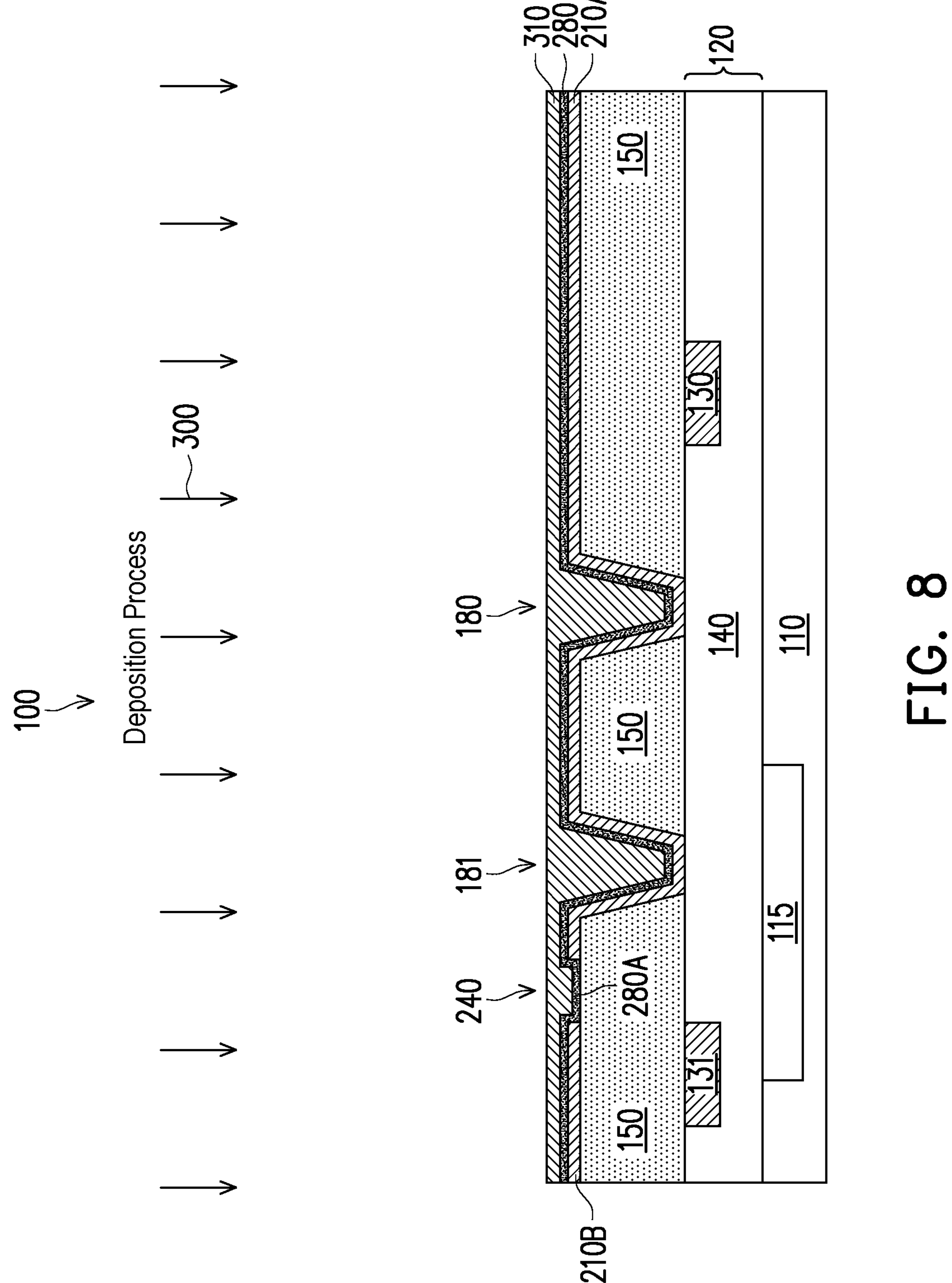

Referring now to FIG. 8, after the formation of the insulator layer 280, a deposition process 300 is performed to the IC device 100. The deposition process 300 may include CVD. PVD, ALD, or combinations thereof. The deposition process 300 deposits a conductive layer 310 over the insulator layer 280. In some embodiments, the conductive layer 310 may have a same material composition as the conductive layer segments 210A and 210B. For example, the conductive layer 310 and the conductive layer segments 210A and 210B may each have a titanium nitride material composition. In other embodiments, the conductive layer 310 may have a different material composition than the conductive layer segments 210A and 210B. Note that whereas the openings 180-181 and 240 are partially filled by the conductive layer segments 210A-210B and/or the insulator layer 280, the openings 180-181 and 240 are completely filled by the conductive layer 310. Therefore, it may be said that portions of the conductive layer 210A, portions of the insulator layer 280, and portions of the conductive layer 310 are collectively embedded in the passivation layer 150. This is one of the unique physical characteristics of the present disclosure, the benefits of which will be discussed in more detail below.

Figure 9:
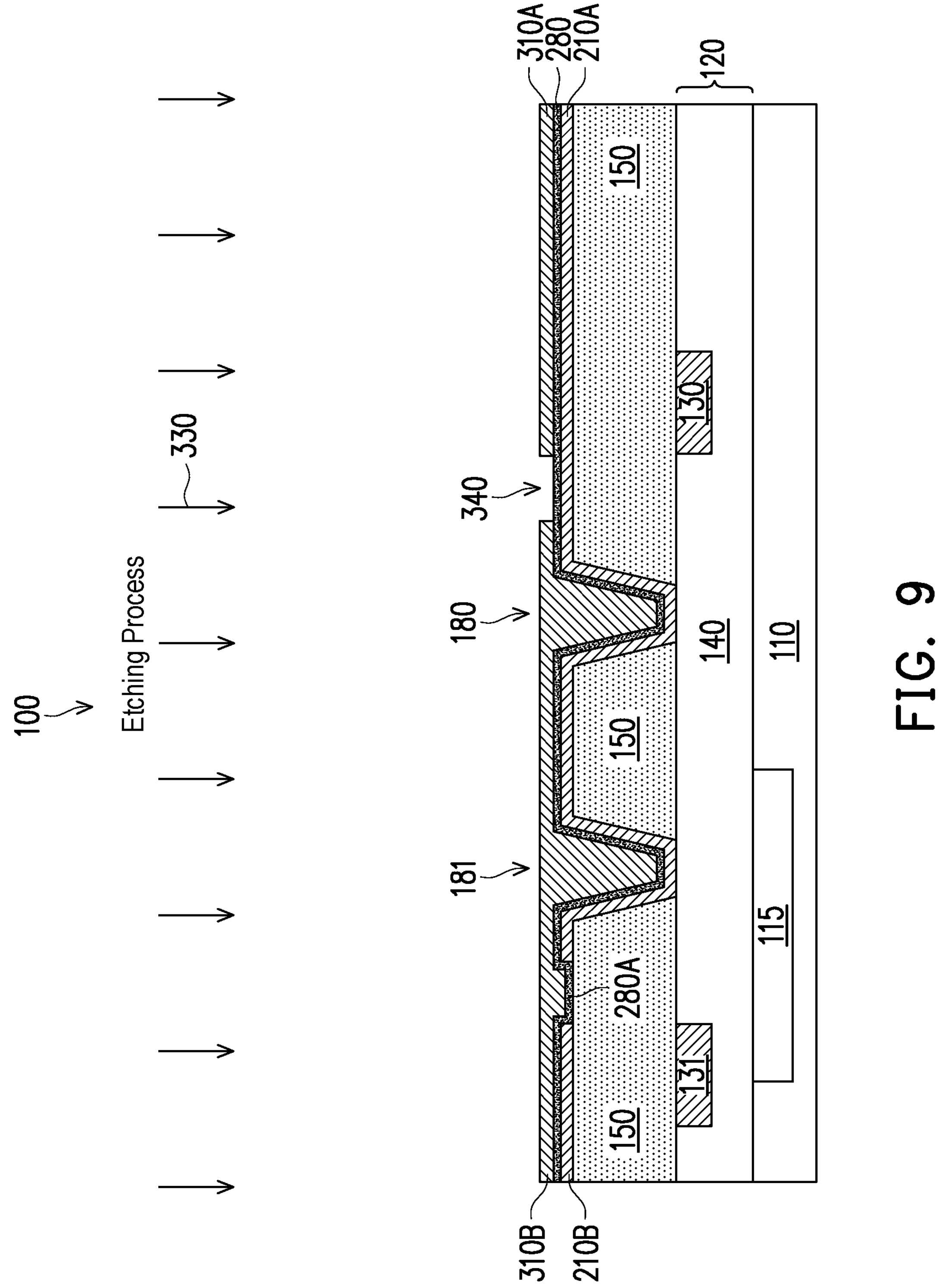

Referring now to FIG. 9, an etching process 330 is performed to the IC device. The etching process 330 etches away a segment of the conductive layer 310 that is disposed horizontally between the metal line 130 and the opening 180. As a result, an opening 340 in the conductive layer 310 exposes a portion of an upper surface of the insulator layer 280 disposed between the metal line 130 and the opening 180 (now filled by the conductive layer 210A, the insulator layer 280, and the conductive layer 310). The conductive layer 310 is therefore broken into two segments 310A and

310B, which are electrically isolated or separated from each other by the opening 340. Note that the etching process 330 may be performed with a patterned photoresist layer serving as an etching mask in some embodiments. However, for reasons of simplicity, the formation and subsequent removal of the patterned photoresist layer is not specifically illustrated herein.

Figure 10:
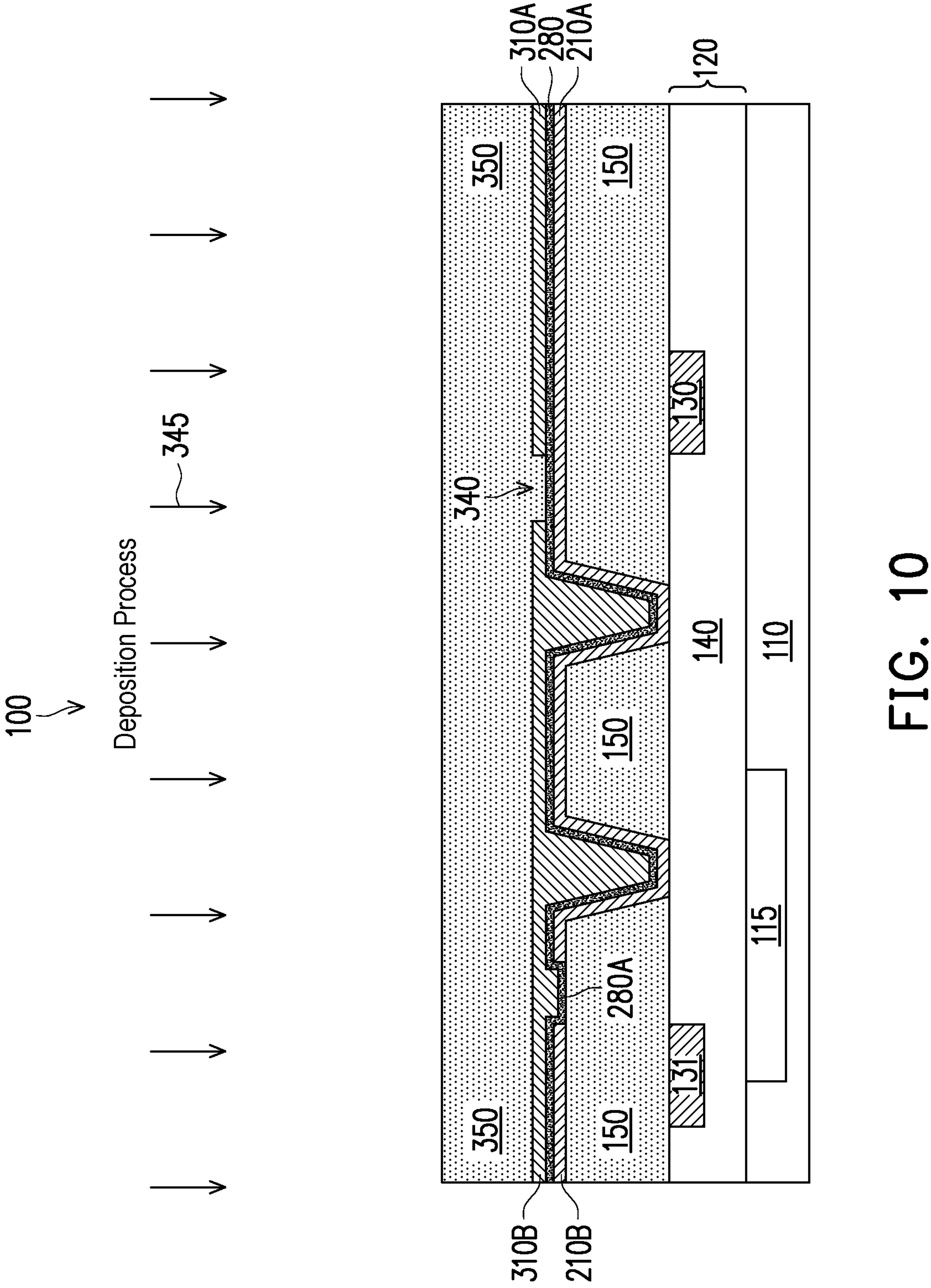

Referring now to FIG. 10, a deposition process 345 is performed to the IC device 100. The deposition process 345 may include a CVD process, a PVD process, an ALD process, or combinations thereof, to deposit a passivation layer 350 over the upper surface of the conductive layer segments 310A and 310B, as well as over the portion of the upper surface of the insulator layer 280 exposed by the opening 340. In some embodiments, the deposition process 345 may include a high-density plasma process to form undoped silicate glass (USG) as the passivation layer 350. In other embodiments, the deposition process 345 may be configured such that the deposited passivation layer 350 has a same material composition as the passivation layer 150. For example, the passivation layer 350 may have a silicon carbon nitride (SiCN) material composition or a silicon nitride (SiN) material composition, in embodiments where the passivation layer 150 also has a SiCN material composition or a SiN material composition. In any case, it can be seen that the passivation layer 350 completely fills the opening 340 and prevents the conductive layer segments 310A and 310B from being in electrical and/or physical contact with one another. In other words, an electrical signal cannot propagate from the conductive layer segment 310A to the conductive layer segment 310B (or vice versa) through the passivation layer 350, since the material of the passivation layer 350 is also electrically insulating.

Figure 11:
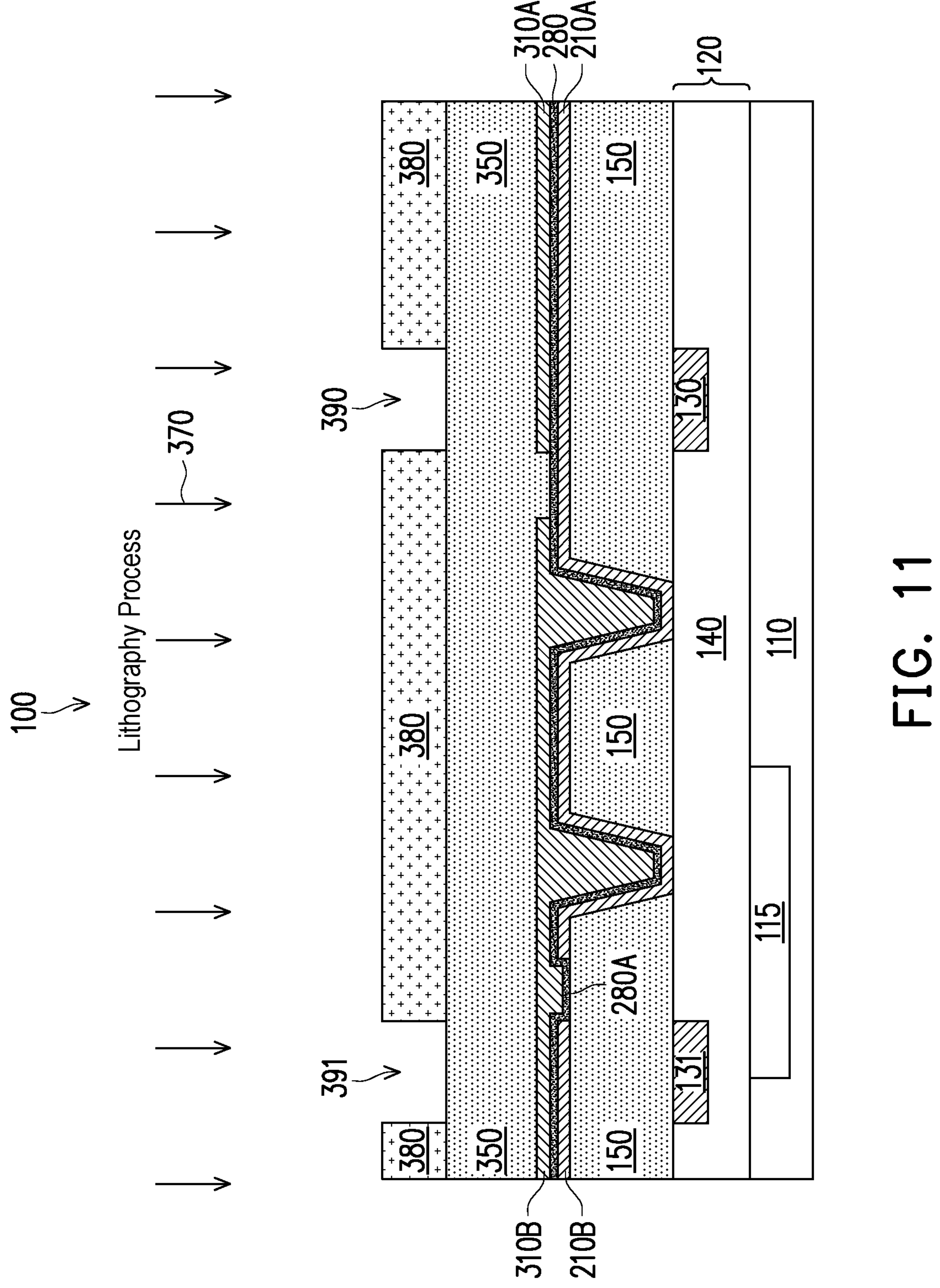

Referring now to FIG. 11, a lithography process 370 is performed to the IC device 100 to form a patterned photoresist layer 380 over the passivation layer 350. The lithography process 370 may include one or more photoresist coating, pre-exposure baking, exposing, post exposure baking, developing, and rinsing processes (not necessarily performed in that order). As a result of the lithography process 370 being performed, the patterned photoresist layer 380 includes a plurality of openings, such as openings 390 and 391 that each exposes a portion of an upper surface of the passivation layer 350.

Figure 12:
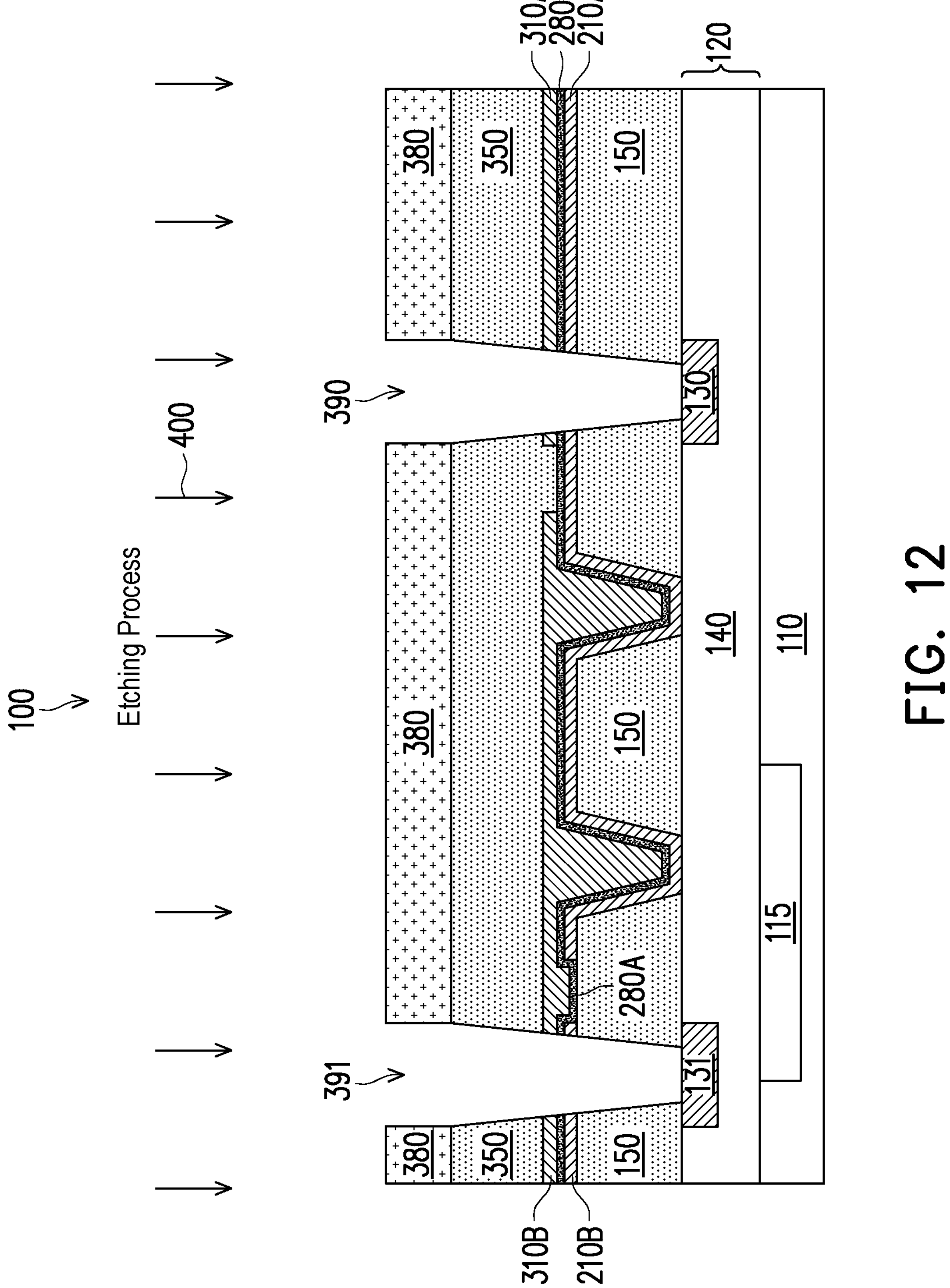

Referring now to FIG. 12, an etching process 400 is performed to the IC device 100. The etching process 400 may include a dry etching process in some embodiments, a wet etching process in some other embodiments, or combinations thereof in yet other embodiments. The etching process 400 extends the openings 390 and 391 further downwards vertically (e.g., in the direction toward the substrate 110), with the patterned photoresist layer 380 serving as an etching mask. In other words, the patterned photoresist layer 380 protects the portions of the passivation layer 350 underneath from being etched, while the other portions of the passivation layer 350 exposed by the openings 390 and 391 are removed by the etching process 400. The openings 390 and 391 in the passivation layer 350 may have a trench-like profile, and as such, may be interchangeably referred to as trenches 390 and 391. Note that the lower portions of the openings 390 and 391 may each have a trapezoidal shape in the cross-sectional side view of FIG. 12, in that the openings 390 and 391 are each wider at the top and narrower at the bottom, with slanted side surfaces. The openings 390 and 391 may extend all the way through the passivation layer 150, such that the upper surfaces of the metal lines 130 and 131 are exposed.

Figure 13:
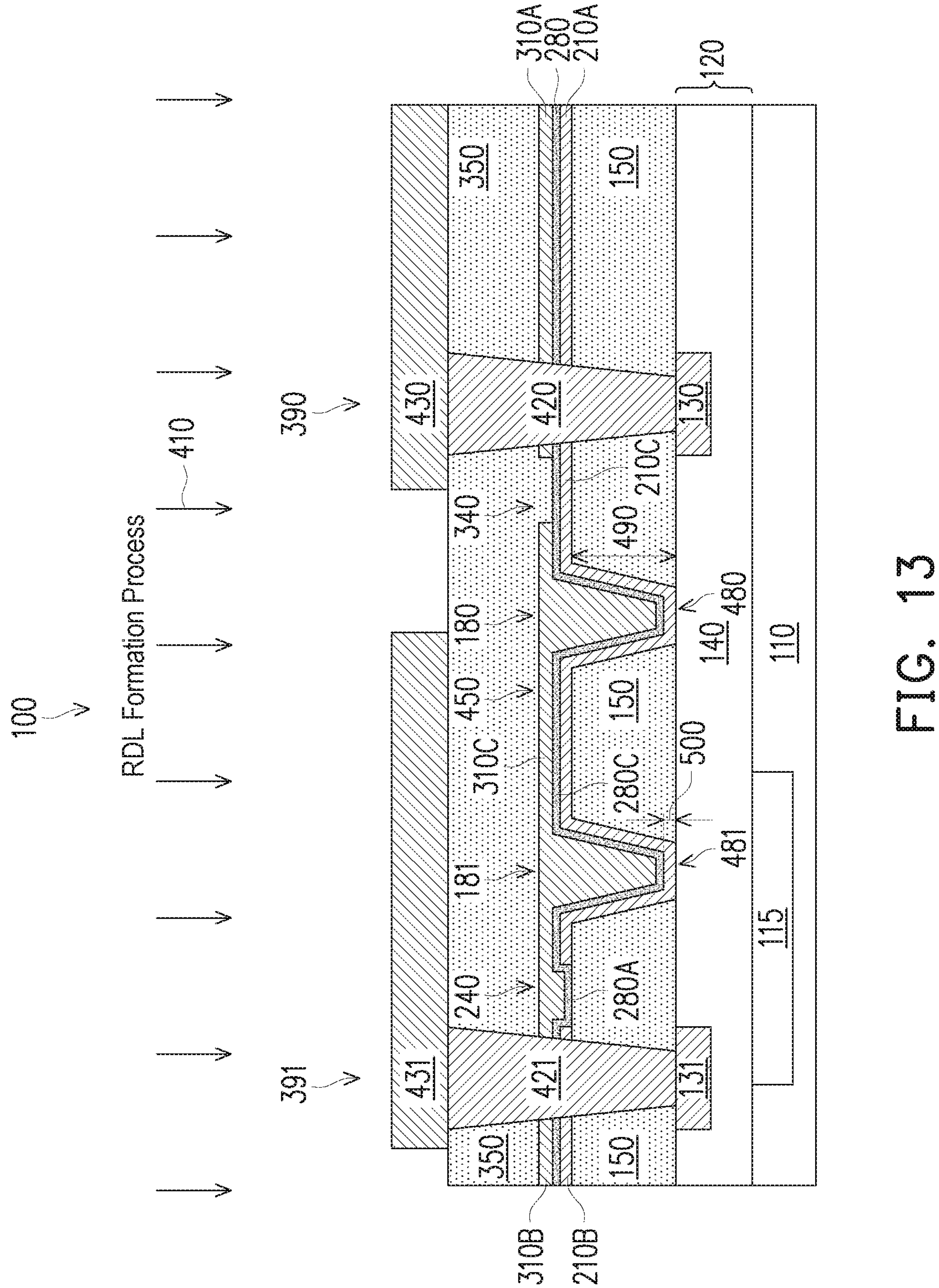

Referring now to FIG. 13, the patterned photoresist layer 380 may be removed by a photoresist stripping or ashing process. Thereafter, an RDL formation process 410 is performed to the IC device. The RDL formation process 410 fills the openings 390 and 391 with one or more conductive materials, such as titanium nitride, tungsten, copper, aluminum, cobalt, ruthenium, etc. As a result, conductive vias 420 and 421 are formed to fill the openings 390 and 391, respectively. The RDL formation process 410 may also form conductive pads 430 and 431 over the conductive vias 420 and 421, respectively. In some embodiments, the conductive pads 430 and 431 may have the same material composition as the conductive vias 420 and 421. It is understood that the conductive vias 420-421 and/or the conductive pads 430-431 may be collectively considered the RDL structures of the IC device 100. In some embodiments, the RDL formation process 410 may include an electroplating process to form the various types of conductive materials of the RDL structures.

Note that due to the etching and the subsequent filling of the openings 390 and 391 (with the conductive vias 420 and 421), the bottom conductive layer 210 has now been broken up into a plurality of distinct conductive layer segments, including the conductive layer segment 210A, the conductive layer segment 210B, and the conductive layer segment 210C. Similarly, the top conductive layer 310 has now been broken up into a plurality of distinct conductive layer segments as well, including the conductive layer segment 310A, the conductive layer segment 310B, and the conductive layer segment 310C. In addition, the insulator layer 280 is also broken up, such that an insulator layer segment 280C is physically separated from the rest of the insulator layer 280. The insulator layer segment 280C is sandwiched between the conductive layer segments 210C and 310C.

At this stage of fabrication, a MIM capacitor 450 is formed. The MIM capacitor 450 includes the conductive layer segment 210C (as a bottom electrode plate), the insulator layer segment 280C, and the conductive layer segment 310C (as a top electrode plate). It is noted that, due to the implementation of the insulator segment 280A filling the opening 240 (see discussions above pertaining to FIG. 7), the electrical connection between the bottom conductive layer 210C and the conductive via 421 (and therefore the conductive pad 431) is cut off. Instead, the electrical access to the conductive layer segment 210C is provided by the conductive pad 430, through the conductive via 420, which is electrically connected to the conductive player segment 210C. Similarly, due to the formation of the opening 340 (see discussions above pertaining to FIG. 9) and the subsequent filling of the opening 340 by the passivation layer 350, the electrical connection between the top conductive layer 310C and the conductive via 420 (and therefore the conductive pad 430) is cut off. Instead, the electrical access to the conductive layer segment 310C is provided by the conductive pad 431, through the conductive via 421, which is electrically connected to the conductive player segment 310C. As such, it may be said that the conductive pads 430 and 431 are used to control the electrical operation of the MIM capacitor 450. For example, different electrical voltage potentials may be applied to the conductive pads 430 and 431.

One of the unique physical characteristics of the MIM capacitor 450 herein is that it has one or more portions that protrude substantially downward into the passivation layer 150. For example, the MIM capacitor 450 has downward protrusions 480 and 481 that protrude in a direction toward the substrate 110, where the downward protrusions 480 and 481 are embedded in the passivation layer 150. These downward protrusions 480 and 481 are an inherent result of the formation of the openings 180 and 181 (see discussions above pertaining to FIG. 4) in the passivation layer 150 and the subsequent filling of the openings 180 and 181 with the various components (see discussions above pertaining to FIGS. 5-8) of the MIM capacitor 450. For example, the conductive layer segment 210C and the insulator layer segment 280C of the MIM capacitor 450 each include portions that substantially inherit the cross-sectional side view profile of the openings 180 and 181. The portions of the conductive layer segment 310C of the MIM capacitor 450 filling the openings 180 and 181 also has lengthy slanted side walls.

The downward protrusions 480 and 481 of the MIM capacitor 450 may also be expressed in terms of a depth 490, which corresponds to a distance between the bottommost surface of the conductive layer segment 210C and an upper surface of the passivation layer 150 (over which the conductive layer segment 210C is formed). In some embodiments, the depth 490 is in a range between about 0.5 microns and about 0.7 microns. MIM capacitors not implemented using the unique process flow herein typically have much smaller depths, to the extent that they have portions that can be considered vertical protrusions. The downward protrusions of the MIM capacitor 450 may also be expressed in terms of the relative sizes of the depth 490 and a thickness 500 of the conductive layer segment 210A. For example, due to the substantial downward protrusion of the MIM capacitor 450, the depth 490 is substantially greater (e.g., multiple times greater) than the thickness 500 of the conductive layer segment 210A. In some embodiments, the depth 490 is in a range between about 400 nm and about 800 nm, and the thickness 500 is in a range between about 20 nm and about 70 nm. In some embodiments, a ratio between the depth 490 and the thickness 500 is in a range between about 5.7:1 and about 40:1.

It is understood that the above range values involving the depth 490 (including the ratio between the depth 490 and the thickness 500) are not randomly chosen, but they are specifically configured to optimize device performance in some embodiments. For example, one benefit of the downward protrusions 480-481 is that they help increase the effective surface area of the MIM capacitor 450. In that regard, the sloping side surfaces between the conductive layer segment 210C and the insulator layer segment 280C and the sloping side surfaces between the conductive layer segment 310C and the insulator layer segment 280C are made possible by the downward protrusions 480-481, and they constitute extra surface areas that would not have existed had the MIM capacitor 450 not been manufactured according to the unique fabrication process flow herein. The extra surface areas gained as a result of the downward protrusions 480-481 lead to an increase in capacitor of the MIM capacitor 450 (which is desirable) without expanding the lateral size of the IC device 100.

On the other hand, if the above ranges involving the depth 490 are too small, then that means the downward protrusions 480-481 have not been made significant enough to achieve as much gain of effective capacitance as possible. In other words, some amount of surface area increase (and therefore capacitance increase) is “left on the table” needlessly. On the other hand, if the above ranges involving the depth 490 are too big, then that means the passivation layer 150 would have to be thicker. As such, the IC device 100 would have a greater overall vertical dimension, which may not be desirable, since the overall vertical dimension of the IC device 100 may have already been pre-specified. In addition, even if an increase in the thickness of the passivation layer 150 is tolerable, it would still translate into a deeper trench filling process, which may bring about certain manufacturing difficulties. In other words, the openings 180 and 181 would have greater aspect ratios (depth versus width), which make them harder to fill (by the various components of the MIM capacitor 450) without trapping bubbles or gaps therein. As such, it may not be desirable to configure the ranges involving the depth 490 to be too small either. Here, the above ranges involving the depth 490 (including its ratio versus the thickness 500) are configured such that the MIM capacitor 450 can achieve a sufficiently great increase in capacitor (due to extra surface area gained) while maintaining the same vertical dimensions as originally specified and/or minimizing manufacturing difficulties or concerns.

Figure 14:
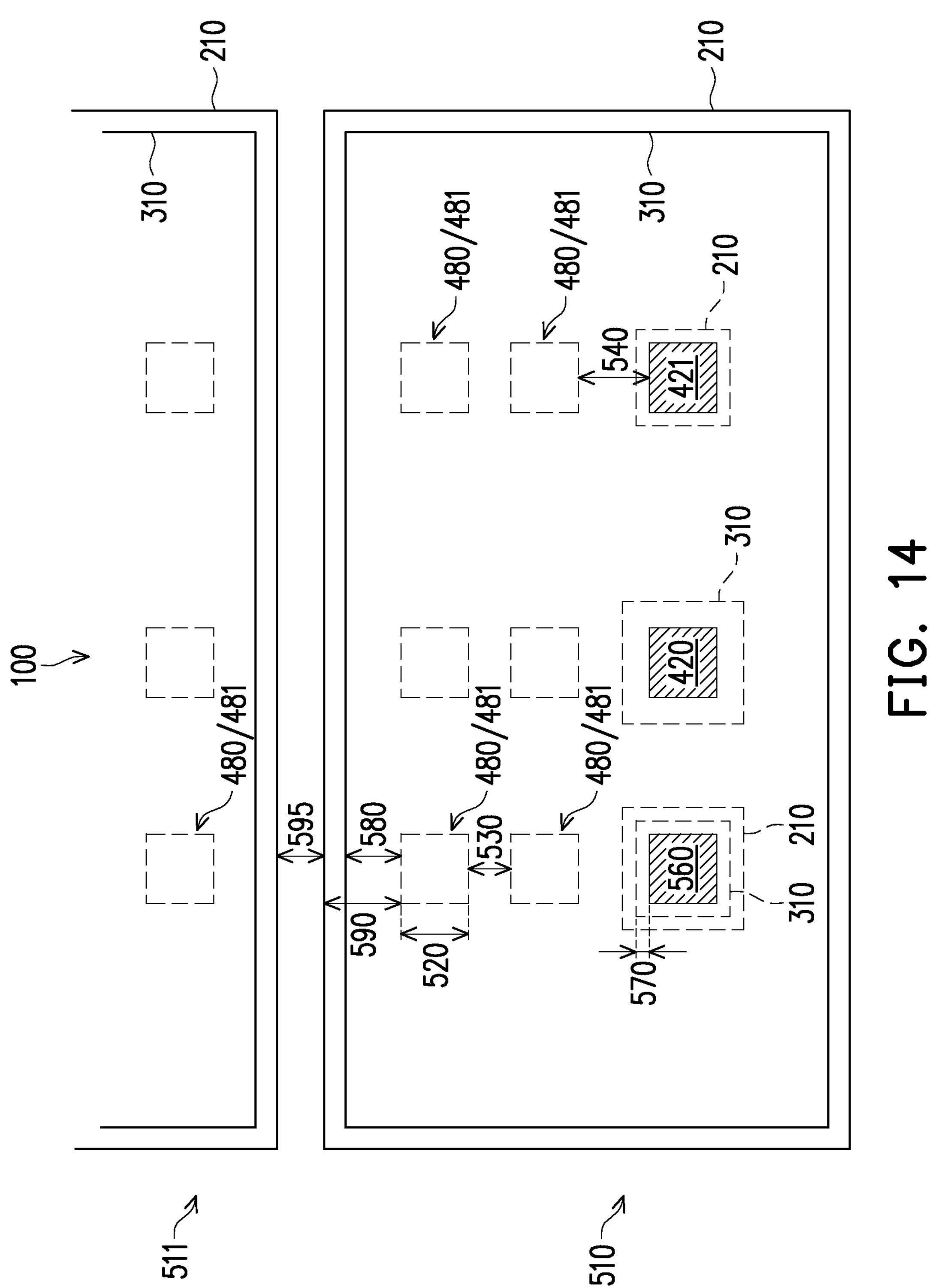
FIG. 14 is a top view of an integrated circuit (IC) device (or portions thereof) at a stage of fabrication according to various aspects of the present disclosure.

FIG. 14 illustrates a simplified diagrammatic fragmentary planar top view of a portion of the IC device 100 to provide further clarifications of the various aspects of the present disclosure. For reasons of consistency and clarity, similar components appearing in FIGS. 1-14 will be labeled the same. It is understood that while the outlines (e.g., boundaries or borders) of the conductive layer 210 and the conductive layer 310 are illustrated in FIG. 14, the outlines of the insulator layer 280 is not shown in FIG. 14 for reasons of simplicity.

As shown in FIG. 14, two example sections 510 and 511 are illustrated. The sections 510 and 511 may be substantially identical to one another, and the IC device 100 may include a plurality of these sections in a repeating manner. It may be said that each section 510 or 511 includes a MIM capacitor structure discussed above with reference to FIGS. 1-13. Within each section (e.g., section 510), the conductive layer 210 and the conductive layer 310 may each have a rectangular top view profile. The area of the conductive layer 210 may be slightly greater than the area of the conductive layer 310, such that the borders of the conductive layer 310 are surrounded by the borders of the conductive layer 210. The outlines of the protrusions 480/481 (corresponding to the locations of the openings discussed above with reference to FIGS. 4-8) are also illustrated. Since the protrusions 480/481 would not be directly visible in the top view of FIG. 14, their outlines are illustrated herein as broken lines.

In the illustrated embodiments, the protrusions 480/481 each have a rectangular top view profile, for example, a substantially square top view profile, where each side has a dimension 520. The protrusions 480/481 may be separated or spaced apart from one another in the top view by a distance 530. In some embodiments, the dimension 520 is in a range between about 0.15 microns and about 0.3 microns, and the distance 530 is in a range between about 0.15 microns and about 0.3 microns, and a ratio between the dimension 520 and the distance 530 is in a range between about 0.5:1 and about 2:1. Such a ratio range is configured to densely pack a sufficient number of the protrusions 480/481 on the IC device 100 to augment the amount of surface area (which in turn increases capacitance of the MIM capacitor 450), while also ensuring that the protrusions 480/481 are not packed too close together to risk electrical shorting and/or complicating the manufacturing of the IC device 100.

The top views of the conductive vias 420 and 421 are also illustrated in FIG. 14. In the illustrated embodiment, the conductive vias 420 and 421 are illustrated as having substantially rectangular (e.g., square) top views, though it is understood that they may have other top view shapes in alternative embodiments. As discussed above, the conductive via 420 is in direct physical contact with the conductive layer 210, but is spaced apart from the conductive layer 310. To further clarify such a physical characteristic, the outline of the conductive layer 310 surrounding the conductive via 420 is illustrated as broken lines in FIG. 14. Similarly, the conductive via 421 is in direct physical contact with the conductive layer 310, but is spaced apart from the conductive layer 210. To further clarify such a physical characteristic, the outline of the conductive layer 210 surrounding the conductive via 421 is illustrated as broken lines in FIG. 14. Note that a minimum distance 540 is also configured between the conductive via 421 and its nearest one of the protrusions 480/481. In some embodiments, the minimum distance 540 is greater than or equal to about 2 microns. Such a value range ensures that the conductive via 421 is sufficiently spaced apart from the protrusions 480/481 to avoid electrical shorting, while not wasting chip space.

Figure 15:
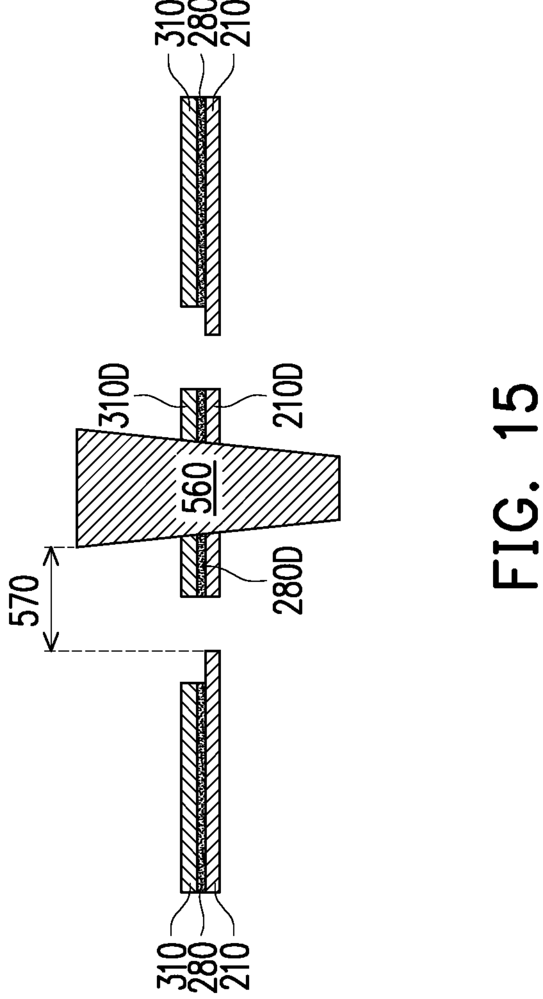
FIG. 15 is a cross-sectional side view of a conductive via and its neighboring components at a stage of fabrication according to various aspects of the present disclosure.

FIG. 14 further illustrates a conductive via 560 that is different from the conductive vias 420 and 421. For example, the conductive via 560 may be a logic via that is used to provide electrical connectivity to logic devices (which may be located elsewhere) on the IC device 100. In this regard, the conductive via 560 is not a part of the MIM capacitor 450, nor is it used to operate the MIM capacitor 450. For example, the conductive via 560 is surrounded by the conductive layers 310 and 210 of the MIM capacitor 450, but the conductive via 560 is not electrically coupled to either the conductive layer 210 or the conductive layer 310. This aspect is also illustrated in FIG. 15, which is a simplified diagrammatic fragmentary cross-sectional side view of the conductive via 560 and some of its neighboring components. As shown in FIG. 15, the conductive via 560 extends vertically through a conductive layer dummy segment 210D, a conductive layer dummy segment 310D, and an insulator layer dummy segment 280D. These dummy segments 210D. 280D, and 310D are fabricated using the same fabrication processes as the rest of the conductive layer 210, the insulator layer 280, and the conductive layer 310, respectively. However, these dummy segments 210D, 280D, and 310D do not serve as capacitor structures herein, and hence they are referred to as dummy segments. The dummy segments 210D, 280D, and 310D are physically and electrically separated from the rest of the conductive layer 210, insulator layer 280, and conductive layer 310, respectively.

The conductive via 560 itself is also spaced apart from the nearest conductive layer 210. For example, as shown in both the top view of FIG. 14 and the cross-sectional side view of FIG. 15, a distance 570 separates the conductive via 560 from the nearest conductive layer 210. In some embodiments, the distance 570 is greater than or equal to about 0.8 microns. Such a value range ensures that the conductive via 560 is sufficiently spaced apart from the nearest conductive layer 210 to avoid electrical shorting, while not wasting chip space.

Referring back to FIG. 14, the protrusion 480/481 that is closest to the border of the conductive layer 310 is still spaced apart from the border of the conductive layer 310 by a distance 580. Meanwhile, the protrusion 480/481 that is closest to the border of the conductive layer 210 is still spaced apart from the border of the conductive layer 210 by a distance 590. In addition, the sections 510 and 511 are separated from one another (e.g., in terms of the spacing between their outermost conductive layers 210) by a distance 595. In some embodiments, the distance 580 is greater than or equal to about 0.2 microns, the distance 590 is greater than or equal to about 0.3 microns, and the distance

595 is greater than or equal to about 0.8 microns. Such value ranges ensure that the fabrication of the MIM capacitor (e.g., with respect to the protrusions 480/481) does not run into fabrication difficulties, and that the chip space within the IC device 100 is efficiently utilized.

Figure 16:
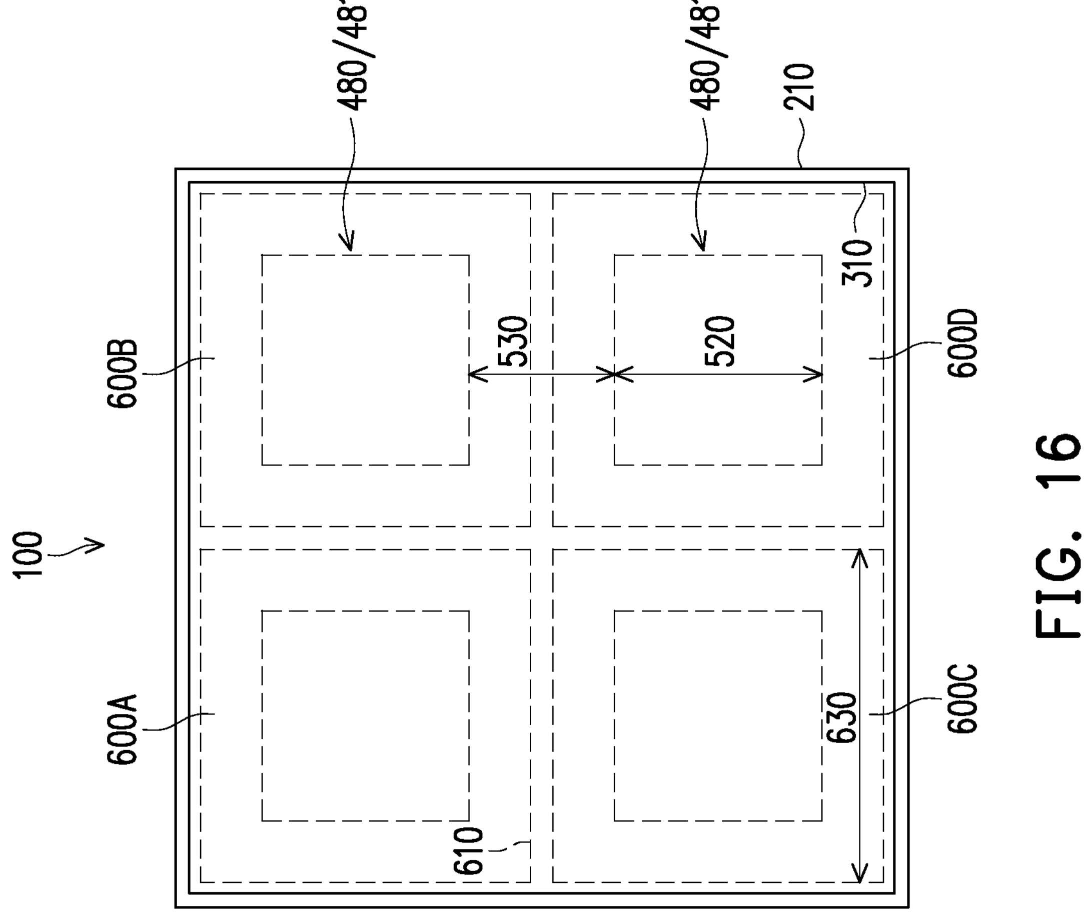
FIGS. 16, 17A, and 17B are top views of an integrated circuit (IC) device (or portions thereof) at a stage of fabrication according to various aspects of the present disclosure.

FIG. 16 is another simplified diagrammatic fragmentary planar top view of a portion of the IC device 100. Again, for reasons of consistency and clarity, similar components appearing in FIGS. 1-16 will be labeled the same. Referring to FIG. 16, the planar top views of a plurality of capacitor units, such as capacitor units 600A, 600B, 600C, and 600D, is illustrated. The capacitor units 600A-600D may be located within the boundaries of the conductive layers 310 and 210, whose boundaries are labeled in FIG. 16 as well.

Each of the capacitor units 600A-600D may include a portion of the MIM capacitor 450 discussed above. In more detail, each of the capacitor units 600A may be configured as having a square top view shape, whose boundaries 610 are denoted by a dashed box. Each of the capacitor units 600A-600D has a horizontal dimension 630. Each of the capacitor units 600A-600D also includes a respective one of the protrusions 480/481 discussed above. The boundaries of the protrusions 480/481 are also denoted by a dashed box that is located within the boundaries 610 of the respective capacitor unit. Each of the protrusions 480/481 has the horizontal dimension 520 (also shown in FIG. 14), and the distance 530 (also shown in FIG. 14) separates adjacent ones of the protrusions 480/481. In some embodiments, the dimension 630 in a range between about 0.3 microns and about 0.6 microns, the dimension 520 in a range between about 0.15 microns and about 0.3 microns, and the distance 530 is in a range between about 0.15 microns and about 0.3 microns. These ranges are carefully configured to ensure that the protrusions 480/481 are sized optimally to provide the capacitance enhancement, while not causing any concerns with electrical shorting and/or fabrication processing difficulties.

It is understood that for each of the capacitor units 600A-600D, the corresponding capacitance is fairly consistent, since the dimensions (e.g., depth and width) of the protrusions 480/481 can be finely controlled across the IC device 100. As such, the capacitance associated with the capacitor units 600A-600D can be unitized, which may be beneficial when determining how the MIM capacitor should be implemented to suit different types of IC applications. For example, based on the capacitance requirements of a given IC application, a calculation can be made as to how many of the capacitor units similar to the capacitor units 600A-600D should be implemented as a part of the MIM capacitor of the present disclosure.

Figure 17B:
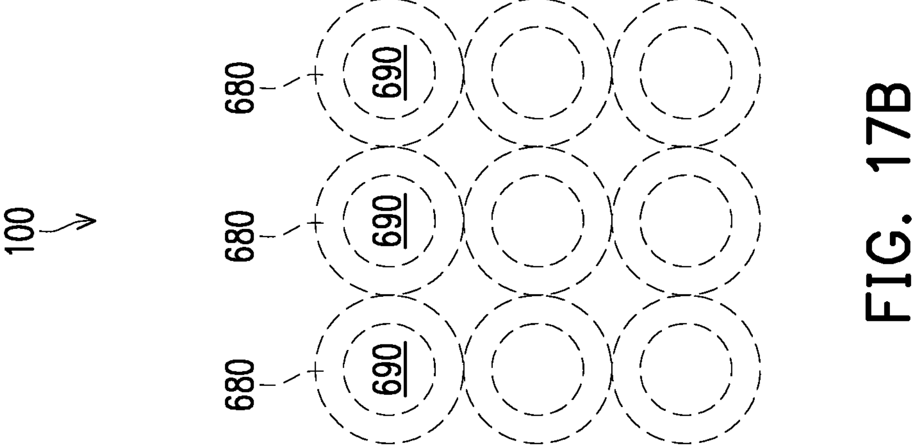
Figure 17A:
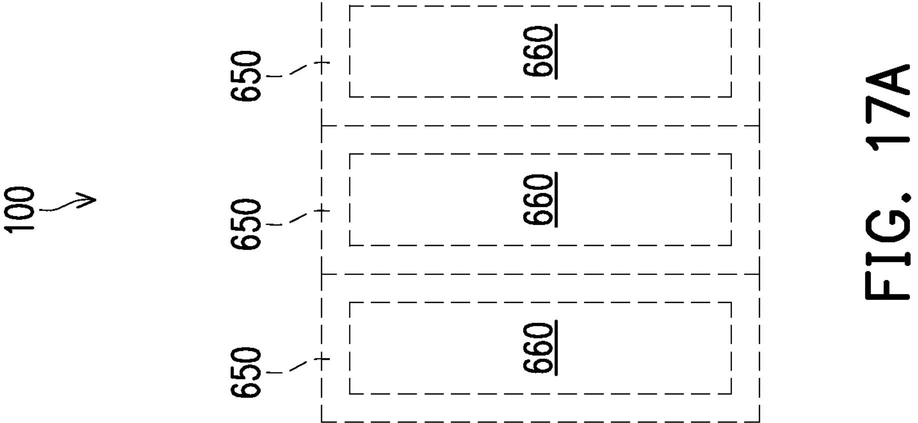

It is further understood that although the capacitor units 600A-600D and the protrusions 480/481 therein are each illustrated as having substantially square shaped top view profiles, other embodiments may implement alternative shapes or profiles. For example, two such non-limiting examples are illustrated in FIGS. 17A and 17B. In FIG. 17A, the top view of a plurality of capacitor units 650 is illustrated, where each of the capacitor units 650 has a substantially rectangular top view shape. Within each of the capacitor units 650, a protrusion 660 is implemented. The protrusion 660 is similar to the protrusion 480/481 discussed above. For example, the protrusion 660 would also protrude vertically downward into a passivation layer (e.g., the passivation layer 150 discussed above) in a cross-sectional side view, as it contains an insulator layer segment sandwiched between two conductive layer segments that collectively fill an opening or a trench. The opening or the trench is configured to have a rectangular top view profile, and as such, the protrusion 660 will inherit the rectangular top view profile accordingly.

Similarly. FIG. 17B, the top view of a plurality of capacitor units 680 is illustrated, where each of the capacitor units 650 has a substantially circular top view shape. Within each of the capacitor units 680, a protrusion 690 is implemented. The protrusion 690 is also similar to the protrusion 480/481 discussed above. For example, the protrusion 690 would also protrude vertically downward into a passivation layer (e.g., the passivation layer 150 discussed above) in a cross-sectional side view, as it contains an insulator layer segment sandwiched between two conductive layer segments that collectively fill an opening or a trench. The opening or the trench is configured to have a circular top view profile, and as such, the protrusion 660 will inherit the circular top view profile accordingly.

Other suitable top view profiles are also envisioned, but they are not specifically illustrated herein for reasons of simplicity.

Figure 18:
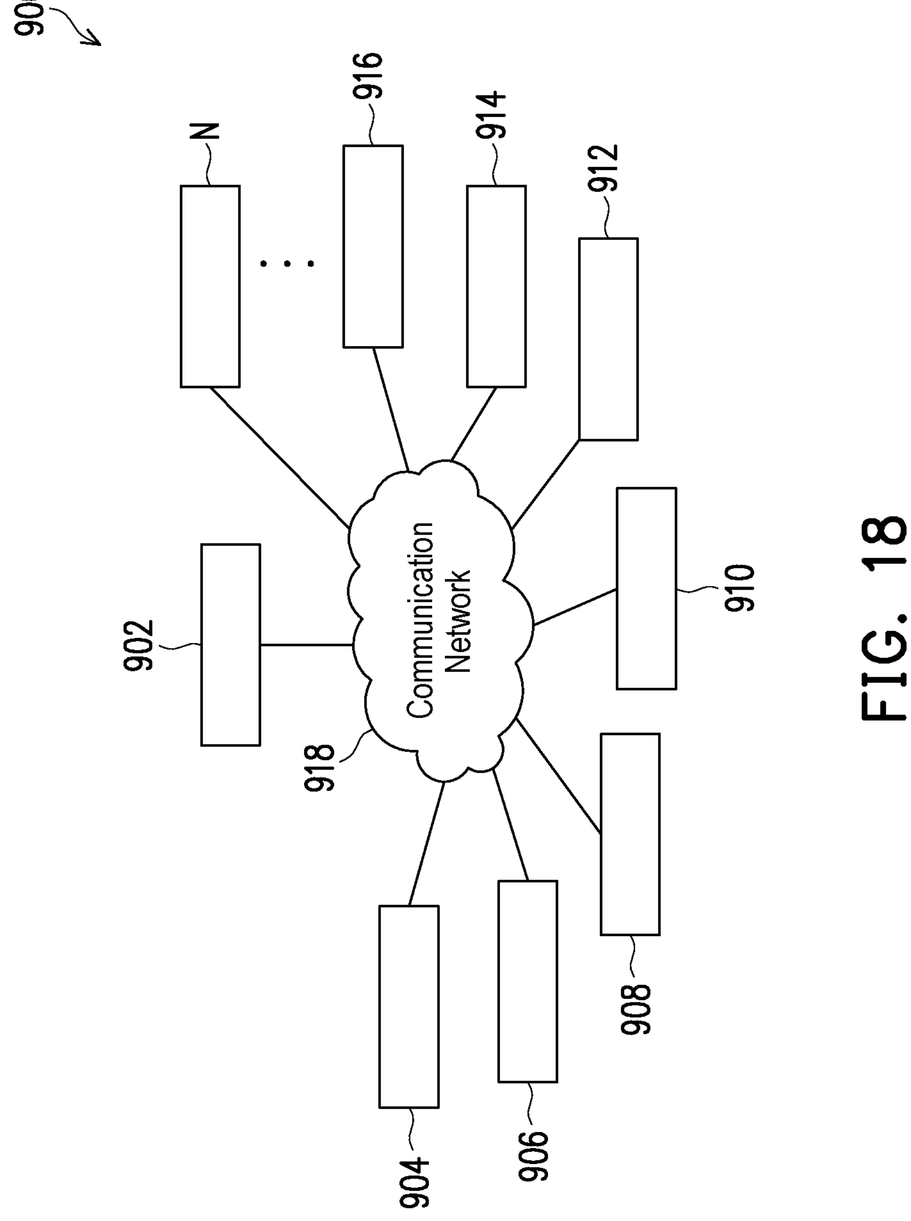
FIG. 18 is a block diagram of an integrated circuit (IC) fabrication system according to various aspects of the present disclosure.

FIG. 18 illustrates an integrated circuit fabrication system 900 according to embodiments of the present disclosure, which may be used to fabricate the IC device 100 of the present disclosure discussed above. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 19:
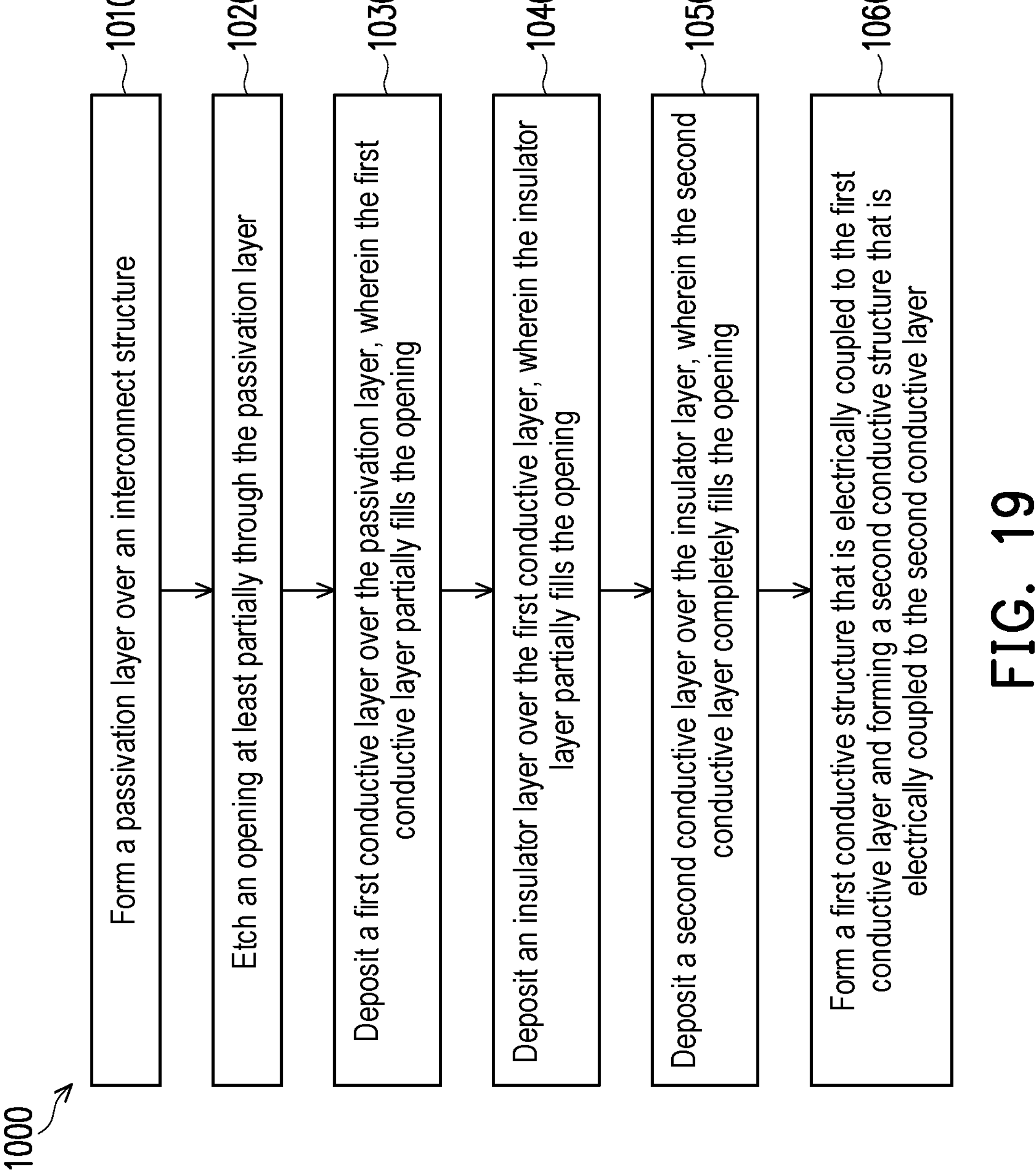
FIG. 19 is a flowchart of a method to fabricate an IC device in accordance with an embodiment of the present disclosure.

FIG. 19 is a flowchart illustrating a method 1000 according to an embodiment of the present disclosure. The method 1000 includes a step 1010 to form a passivation layer over an interconnect structure.

The method 1000 includes a step 1020 to etch an opening at least partially through the passivation layer.

The method 1000 includes a step 1030 to deposit a first conductive layer over the passivation layer. The first conductive layer partially fills the opening.

The method 1000 includes a step 1040 to deposit an insulator layer over the first conductive layer. The insulator layer partially fills the opening.

The method 1000 includes a step 1050 to deposit a second conductive layer over the insulator layer. The second conductive layer completely fills the opening.

The method 1000 includes a step 1060 to form a first conductive structure that is electrically coupled to the first conductive layer and forming a second conductive structure that is electrically coupled to the second conductive layer.

In some embodiments, the opening is etched partially, but not completely, through the passivation layer.

In some embodiments, the passivation layer is a first passivation layer. The opening is a first opening. In some embodiments, the method further includes steps performed before, during, or after the steps 1010-1060. For example, after the second conductive layer has been deposited, the method 1000 may include a step of etching a second opening through a segment of the second conductive layer outside the first opening but not through the insulator layer and the first conductive layer. The method 1000 may further include a step of forming a second passivation layer over the second conductive layer. The second passivation layer fills the second opening. In some embodiments, the forming of the first conductive structure comprises: etching a third opening through the second passivation layer, the second conductive layer, the insulator layer, the first conductive layer, and the first passivation layer. The second opening is disposed between the first opening and the third opening. The method may further include a step of filling the third opening with a conductive material that is electrically coupled to the first conductive layer. In some embodiments, the interconnect structure includes at least a first metal interconnect component and a second metal interconnect component. In some embodiments, the third opening is etched to expose an upper surface of the first metal interconnect component. In some embodiments, the conductive material filling the third opening is formed directly on the first metal interconnect component. In some embodiments, the method may further include a step of forming a conductive pad directly on the conductive material filling the third opening, such that the conductive pad is electrically coupled to the first conductive layer but not to the second conductive layer.

In some embodiments, the opening is a first opening. In some embodiments, the method further includes steps performed before, during, or after the steps 1010-1060. For example, the method further comprises, after the first conductive layer has been deposited but before the insulator layer has been deposited, etching a second opening through a segment of the first conductive layer outside the first opening. The depositing of the insulator layer and the depositing of the second conductive layer fill the second opening. In some embodiments, the passivation layer is a first passivation layer. In some embodiments, the forming of the second conductive structure comprises: forming a second passivation layer over the second conductive layer; etching a third opening through the second passivation layer, the second conductive layer, the insulator layer, the first conductive layer, and the first passivation layer, wherein the second opening is disposed between the first opening and the third opening; and filling the third opening with a conductive material that is electrically coupled to the second conductive layer. In some embodiments, the interconnect structure includes at least a first metal interconnect component and a second metal interconnect component. In some embodiments, the third opening is etched to expose an upper surface of the second metal interconnect component. In some embodiments, the conductive material filling the third opening is formed directly on the second metal interconnect component. In some embodiments, the method 1000 may further include a step of forming a conductive pad directly on the conductive material filling the third opening, such that the conductive pad is electrically coupled to the second conductive layer but not to the first conductive layer.

In some embodiments, the first conductive layer, the insulator layer, and the second conductive layer collectively form a first metal-insulator-metal (MIM) capacitor structure. the method further comprises forming a second MIM capacitor structure over the first MIM capacitor structure.

It is understood that additional processes may be performed before, during, or after the steps 1010-1060 of the method 1000. For example, the first conductive layer, the insulator layer, and the second conductive layer may collectively form a first metal-insulator-metal (MIM) capacitor structure. The method 1000 further comprises forming a second MIM capacitor structure over the first MIM capacitor structure. The method 1000 may further include steps of forming the components of the interconnect structure, or transistors of electrical circuitry.

In summary, the present disclosure involves a unique fabrication flow to form a MIM capacitor with protruding portions embedded in a passivation layer. For example, an opening is etched in the passivation layer, and a first conductive layer, an insulator layer, and a second conductive layer are deposited to fill the opening. The MIM capacitor is formed by the first conductive layer, the insulator layer, and the second conductive layer (e.g., as two electrode plates having a dielectric sandwiched in between). The portion of the MIM capacitor that protrudes downwardly into (and is embedded in) the passivation layer is an inherent result of the unique fabrication process flow being performed herein. For example, without the etching of the opening into the passivation layer, the MIM capacitor would not have the downwardly protruding portions that are embedded in the passivation layer.

The MIM capacitor of the present disclosure offers advantages. It is understood, however, that other embodiments may offer additional advantages, and not all advantages are necessarily disclosed herein, and that no particular advantage is required for all embodiments. One advantage is increased capacitance. In more detail, a capacitance of a capacitor is directly correlated with a surface area between the dielectric material and the conductive electrode plates between which the dielectric material is located. Other types of MIM capacitors typically rely on enlarging their lateral dimensions to increase their capacitance. Unfortunately, doing so is at the cost of consuming valuable IC chip real estate. In comparison, the MIM capacitor of the present disclosure can gain extra surface area between the insulator layer and the conductive layers through the downwardly protruding portions that are embedded in the passivation layer below. As such, the MIM capacitor of the present disclosure can achieve a greater capacitance without requiring extra IC chip area, which is desirable. Another advantage is that the extra capacitance gained by forming portions of the MIM capacitor in the passivation layer is fairly consistent, easily to calculate, and therefore can be unitized. In other words, if a certain IC application desires a certain amount of capacitance, a determination may be made beforehand as to how many units (e.g., corresponding to the downwardly protruding portions) of the MIM capacitor may be needed to achieve such a capacitance. Other advantages include compatibility with existing fabrication and/or packaging processes, so the present disclosure does not require additional processing and is therefore easy and cheap to implement.

Thus, the present disclosure provides a device. The device includes an interconnect structure. A first passivation layer is disposed over the interconnect structure. A recess is disposed within the first passivation layer. A first conductive layer is disposed over the interconnect structure and partially within the recess. An insulator layer is disposed over the first conductive layer and partially within the recess. A second conductive layer is disposed over the insulator layer. The second conductive layer completely fills the recess. A second passivation layer is disposed over the second conductive layer.

The present disclosure also provides a device. The device includes a first passivation layer disposed over an interconnect structure. The device includes a second passivation layer disposed over the first passivation layer. The device further includes a metal-insulator-metal (MIM) capacitor disposed between the first passivation layer and the second passivation layer. The MIM capacitor includes a downward protruding portion that protrudes at least partially through the first passivation layer.

The present disclosure further provides a method. A passivation layer is formed over an interconnect structure. An opening is etched at least partially through the passivation layer. A first conductive layer is deposited over the passivation layer. The first conductive layer partially fills the opening. An insulator layer is deposited over the first conductive layer. The insulator layer partially fills the opening. A second conductive layer is deposited over the insulator layer. The second conductive layer completely fills the opening. A first conductive structure is formed that is electrically coupled to the first conductive layer. A second conductive structure is formed that is electrically coupled to the second conductive layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
- an interconnect structure;
- a first passivation layer disposed over the interconnect structure;
- a recess disposed within the first passivation layer;
- a first conductive layer disposed over the interconnect structure and partially within the recess;
- an insulator layer disposed over the first conductive layer and partially within the recess;
- a second conductive layer disposed over the insulator layer, wherein the second conductive layer completely fills the recess; and
- a second passivation layer disposed over the second conductive layer, wherein the second passivation layer and the first passivation layer have different material compositions.

2. The device of claim 1, further comprising:
- a first conductive via that extends through the second passivation layer, the second conductive layer, the insulator layer, the first conductive layer, and the first passivation layer, wherein the first conductive via is electrically coupled to the first conductive layer disposed in the recess but not to the second conductive layer disposed in the recess; and
- a second conductive via that extends through the second passivation layer, the second conductive layer, the insulator layer, the first conductive layer, and the first passivation layer, wherein the second conductive via is electrically coupled to the second conductive layer disposed in the recess but not to the first conductive layer disposed in the recess.

3. The device of claim 2, wherein:
- a portion of the second passivation layer disposed between the recess and the first conductive via has a downward protrusion that extends through a segment of the second conductive layer but not through the insulator layer or the first conductive layer; and
- a portion of the second conductive layer disposed between the recess and the second conductive via has a downward protrusion that extends through the insulator layer and the first conductive layer but not through the first passivation layer.

4. The device of claim 1, wherein the first conductive layer, the insulator layer, and the second conductive layer collectively form a first metal-insulator-metal (MIM) capacitor, and wherein the device further comprises a second MIM capacitor disposed at least partially over the second passivation layer.

5. The device of claim 4, wherein the first MIM capacitor has a rectangular top view profile or a circular top view profile.

6. The device of claim 1, wherein:
the first conductive layer and the second conductive layer contain titanium nitride; and
the insulator layer contains hafnium oxide or zirconium oxide.

7. A device, comprising:
a first passivation layer disposed over an interconnect structure;
a second passivation layer disposed over the first passivation layer;
a first metal-insulator-metal (MIM) capacitor disposed between the first passivation layer and the second passivation layer, wherein the first MIM capacitor includes a downward protruding portion that protrudes at least partially through the first passivation layer; and
a second MIM capacitor disposed over the first MIM capacitor, wherein the second MIM capacitor lacks a downwardly protruding portion.

8. The device of claim 7, wherein:
the MIM capacitor includes a first conductive layer, an insulator layer disposed over the first conductive layer, and a second conductive layer over the insulator layer; and
the second conductive layer includes a further downwardly protruding portion that is in direct contact with side surfaces of the insulator layer and the first conductive layer.

9. The device of claim 7, wherein the first passivation layer and the second passivation layer having different material compositions.

10. The device of claim 7, wherein the first MIM capacitor or the second MIM capacitor has a rectangular top view profile or a circular top view profile.

11. The device of claim 7, further comprising:
a first conductive via that extends through the second passivation layer, the first MIM capacitor, and the first passivation layer, wherein the first conductive via is electrically coupled to a first terminal of the first MIM capacitor; and
a second conductive via that extends through the second passivation layer, the first MIM capacitor, and the first passivation layer, wherein the second conductive via is electrically coupled to a second terminal of the first MIM capacitor.

12. The device of claim 11, wherein:
the first terminal and the second terminal of the first MIM capacitor each contain titanium nitride; and
an insulator layer of the first MIM capacitor that separates the first terminal and the second terminal contains hafnium oxide or zirconium oxide.

13. A method, comprising:
forming a passivation layer over an interconnect structure;
etching an opening partially, but not completely, through the passivation layer;
depositing a first conductive layer over the passivation layer, wherein the first conductive layer partially fills the opening;
depositing an insulator layer over the first conductive layer, wherein the insulator layer partially fills the opening;
depositing a second conductive layer over the insulator layer, wherein the second conductive layer completely fills the opening; and
forming a first conductive structure that is electrically coupled to the first conductive layer and forming a second conductive structure that is electrically coupled to the second conductive layer.

14. The method of claim 13, wherein the passivation layer is a first passivation layer, wherein the opening is a first opening, and wherein the method further comprises, after the second conductive layer has been deposited:
etching a second opening through a segment of the second conductive layer outside the first opening but not through the insulator layer and the first conductive layer; and
forming a second passivation layer over the second conductive layer, wherein the second passivation layer fills the second opening.

15. The method of claim 14, wherein the forming of the first conductive structure comprises:
etching a third opening through the second passivation layer, the second conductive layer, the insulator layer, the first conductive layer, and the first passivation layer, wherein the second opening is disposed between the first opening and the third opening; and
filling the third opening with a conductive material that is electrically coupled to the first conductive layer.

16. The method of claim 15, wherein:
the interconnect structure includes at least a first metal interconnect component and a second metal interconnect component;
the third opening is etched to expose an upper surface of the first metal interconnect component;
the conductive material filling the third opening is formed directly on the first metal interconnect component; and
the method further comprises forming a conductive pad directly on the conductive material filling the third opening, such that the conductive pad is electrically coupled to the first conductive layer but not to the second conductive layer.

17. The method of claim 13, wherein the opening is a first opening, and wherein the method further comprises, after the first conductive layer has been deposited but before the insulator layer has been deposited, etching a second opening through a segment of the first conductive layer outside the first opening, wherein the depositing of the insulator layer and the depositing of the second conductive layer fill the second opening.

18. The method of claim 17, wherein the passivation layer is a first passivation layer, and wherein the forming of the second conductive structure comprises:
forming a second passivation layer over the second conductive layer;
etching a third opening through the second passivation layer, the second conductive layer, the insulator layer, the first conductive layer, and the first passivation layer, wherein the second opening is disposed between the first opening and the third opening; and
filling the third opening with a conductive material that is electrically coupled to the second conductive layer.

19. The method of claim 18, wherein:
the interconnect structure includes at least a first metal interconnect component and a second metal interconnect component;
the third opening is etched to expose an upper surface of the second metal interconnect component;
the conductive material filling the third opening is formed directly on the second metal interconnect component; and the method further comprises forming a conductive pad directly on the conductive material filling the third opening, such that the conductive pad is electrically coupled to the second conductive layer but not to the first conductive layer.

20. The method of claim 13, wherein the first conductive layer, the insulator layer, and the second conductive layer collectively form a first metal-insulator-metal (MIM) capacitor structure, and wherein the method further comprises forming a second MIM capacitor structure over the first MIM capacitor structure.

* * * * *